(12) United States Patent
Johnstone

(10) Patent No.: US 7,353,593 B2
(45) Date of Patent: Apr. 8, 2008

(54) METHOD FOR ASSEMBLING MICRO STRUCTURES

(75) Inventor: Robert W. Johnstone, Burnaby (CA)

(73) Assignee: Simon Fraser University, Burnaby, British Columbia (CA)

( * ) Notice: Subject to any disclaimer, the term of this patent is extended or adjusted under 35 U.S.C. 154(b) by 632 days.

(21) Appl. No.: 10/434,152

(22) Filed: May 9, 2003

(65) Prior Publication Data
US 2003/0192179 A1   Oct. 16, 2003

Related U.S. Application Data

(63) Continuation-in-part of application No. 10/212,255, filed on Aug. 6, 2002, now abandoned.

(60) Provisional application No. 60/309,793, filed on Aug. 6, 2001.

(51) Int. Cl.
*H05K 3/30* (2006.01)

(52) U.S. Cl. .................... 29/832; 29/834; 29/836; 29/900; 257/215; 385/18

(58) Field of Classification Search .......... 29/830–832, 29/834–836, 592.1, 595, 900, DIG. 95; 257/666–668, 257/415, 421; 335/78, 83, 123, 128; 369/112, 369/122, 112.01; 359/390–394; 385/14, 385/18; 438/52
See application file for complete search history.

(56) References Cited

U.S. PATENT DOCUMENTS

| | | | | |
|---|---|---|---|---|
| 3,648,281 A | * | 3/1972 | Dahms et al. | ......... 340/815.62 |
| 5,646,928 A | * | 7/1997 | Wu et al. | ............... 369/112.24 |
| 5,923,798 A | * | 7/1999 | Aksyuk et al. | ............... 385/19 |
| 5,945,898 A | | 8/1999 | Judy et al. | |
| 5,963,367 A | * | 10/1999 | Aksyuk et al. | ............. 359/392 |
| 5,994,159 A | * | 11/1999 | Aksyuk et al. | ............... 438/52 |
| 6,498,870 B1 | * | 12/2002 | Wu et al. | ..................... 385/18 |
| 6,543,087 B2 | * | 4/2003 | Yeh et al. | ................... 310/326 |

OTHER PUBLICATIONS

K. S. J. Pister, M. W. Judy, S. R. Burgett and R. S. Fearing—"Microfabricated Hinges", *Sensors and Actuators A*. vol. 33, No. 3, pp. 249-256, 1992.

M. C. Wu, L. Y. Lin and S. S. Lee—"Micromachined Free-Space Integrated Optics", *Proc. SPIE* vol. 2291, Integrated Optics and Microstructures II, San Diego, CA, Jul. 28, 1994.

* cited by examiner

*Primary Examiner*—Donghai D. Nguyen
(74) *Attorney, Agent, or Firm*—Oyen Wiggs Green & Mutala LLP

(57) ABSTRACT

A method for making three-dimensional structures comprises providing a plurality of components, each of which is moveably coupled to a substrate. The components may be pivotally coupled to the substrate by one or more micromachined hinges. The components are moved using electrostatic forces which lift the components from the surface of the substrate. The components may then be moved further by providing electrostatic forces between components. Two or more components may engage with one another to provide a three-dimensional structure.

39 Claims, 18 Drawing Sheets

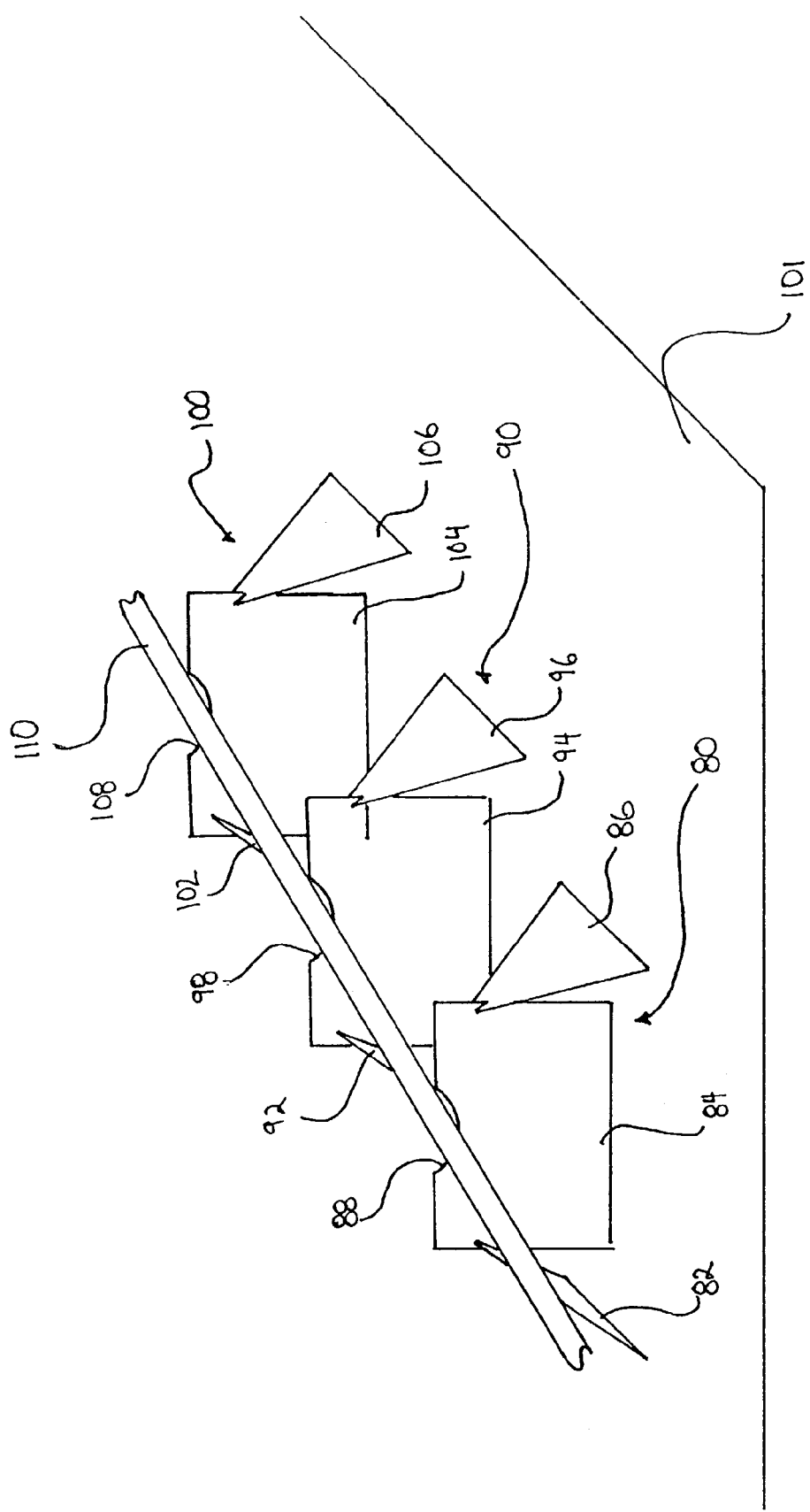

METHOD FOR ASSEMBLING MICRO STRUCTURES

CROSS-REFERENCE TO RELATED APPLICATIONS

This is a continuation-in-part of U.S. patent application Ser. No. 10/212,255, filed 6 Aug. 2002, now abandoned, and claims the benefit of U.S. provisional patent application No. 60/309,793, filed 6 Aug. 2001.

TECHNICAL FIELD

The invention applies to surface micromachined structures. In particular, the invention relates to methods for making miniature three-dimensional structures and related apparatus.

BACKGROUND

Surface processing techniques have been developed to fabricate micromachined structures on substrates. In some cases, one or more components of such micromachined structures are connected to the substrate by hinges. The hinges permit the components to be raised from the substrate by pivoting around a hinge axis. Current techniques known to the inventor for assembling such raised structures involve: physically manipulating the hinged components using tiny probe tips moved by micromanipulators; and using the surface tension of fluid (such as solder or photoresist) to raise the hinged components.

Microelectronic probes are a well known tool in the microelectronics industry for making precision electronic measurements on semiconductor wafers. Typically, these probes comprise fine needlelike tips which may be actuated using micro-manipulators and micro-actuators, such that the probe tips make electrical contact with the wafer.

Microelectronic probes are unsatisfactory for the purpose of raising three-dimensional micromachined structures and manipulating their hinged components. The relatively coarse manoeuverability of microelectronic probes limits their effectiveness and may result in damage to the micromachined structures. Furthermore, each component of each micromachined structure must be independently moved into place, which may be a tedious and time consuming process.

There is a general desire to improve the methods for making three-dimensional micromachined structures and to provide related apparatus.

SUMMARY OF THE INVENTION

One aspect of the invention provides a method for making a three-dimensional structure. A first component, which is moveably coupled to a substrate, is moved by applying an electrostatic force thereto. A second component is engaged with the first component, so as to support the first component in a desired orientation relative to the substrate.

Moving the first component relative to the substrate may involve pivoting one or more micro-mechanical hinges.

Applying the electrostatic force to the first component may involve creating a potential difference between the first component and at least one conductive surface that is located proximate to the first component.

Engaging the second component with the first component may involve moving the second component relative to the substrate by applying a second electrostatic force thereto. Applying the second electrostatic force to the second component may involve creating a potential difference between the second component and at least one conductive surface that is located proximate to the second component.

Applying the voltage to the conductive surface(s) may comprise maintaining the conductive surface(s) at a ground potential.

Engaging the second component with the first component may comprise applying a third electrostatic force between the first component and the second component to move at least one of the first and second components into engagement with one another. The third electrostatic force may be applied after the application of the first and second electrostatic forces. Applying the third electrostatic force may involve creating a potential difference between the first component and the second component, which itself may involve maintaining one of the first and second components at a ground potential.

Engaging the second component with the first component may involve moving the first component in a manner that causes a corresponding movement of the second component into engagement with the first component.

Engaging the second component with the first component may comprise passing current between the first and second components to form a bridge of material therebetween.

Another aspect of the invention relates to a method for making a three-dimensional structure. The method involves a plurality of components hingedly coupled to a substrate. Through the application of electrostatic forces to the components, the components are pivoted into positions in which they can be inter-engaged. The components are then engaged with one another to provide a three-dimensional structure.

Another aspect of the invention relates to a method and apparatus for making a three-dimensional structure, which involve a first component pivotally mounted to a substrate about a first axis and a brace component pivotally mounted to the substrate about a second axis. A first electrostatic force is applied to the first component to pivot the first component about the first axis and a second electrostatic force is applied to the brace component to pivot the brace component about the second axis. A third electrostatic force is then applied between the first component and the brace component, to attract the brace component toward the first component, further pivoting the brace component about the second axis until the brace component engages and supports the first component in a substantially upright orientation.

Further features and applications of the invention are described below.

BRIEF DESCRIPTION OF THE DRAWINGS

In drawings which depict non-limiting embodiments of the invention:

FIG. 5 shows a plurality of multi-component micromachined structures of the type shown in FIG. 3 assembled to support an optical fiber;

DETAILED DESCRIPTION

Throughout the following description, specific details are set forth in order to provide a more thorough understanding of the invention. However, the invention may be practiced without these particulars. In other instances, well known elements have not been shown or described in detail to avoid unnecessarily obscuring the invention. Accordingly, the specification and drawings are to be regarded in an illustrative, rather than a restrictive, sense.

Methods for making three-dimensional micromachined structures according to this invention involve positional and/or orientational adjustment of hinged micromachined components to make the three-dimensional structures. The invention has particular application to micromachined structures comprising components which are pivotally connected to a substrate by micro-mechanical hinges. The micro-mechanical hinges permit positional and/or orientational adjustment of the hinged components by rotating the hinged components about the hinge axis. The hinged micromachined components may have flattened profile and may be formed in various desired shapes. A plurality of hinged micromachined components may be engaged with one another to form multi-component three-dimensional micromachined structures.

Figure 1:
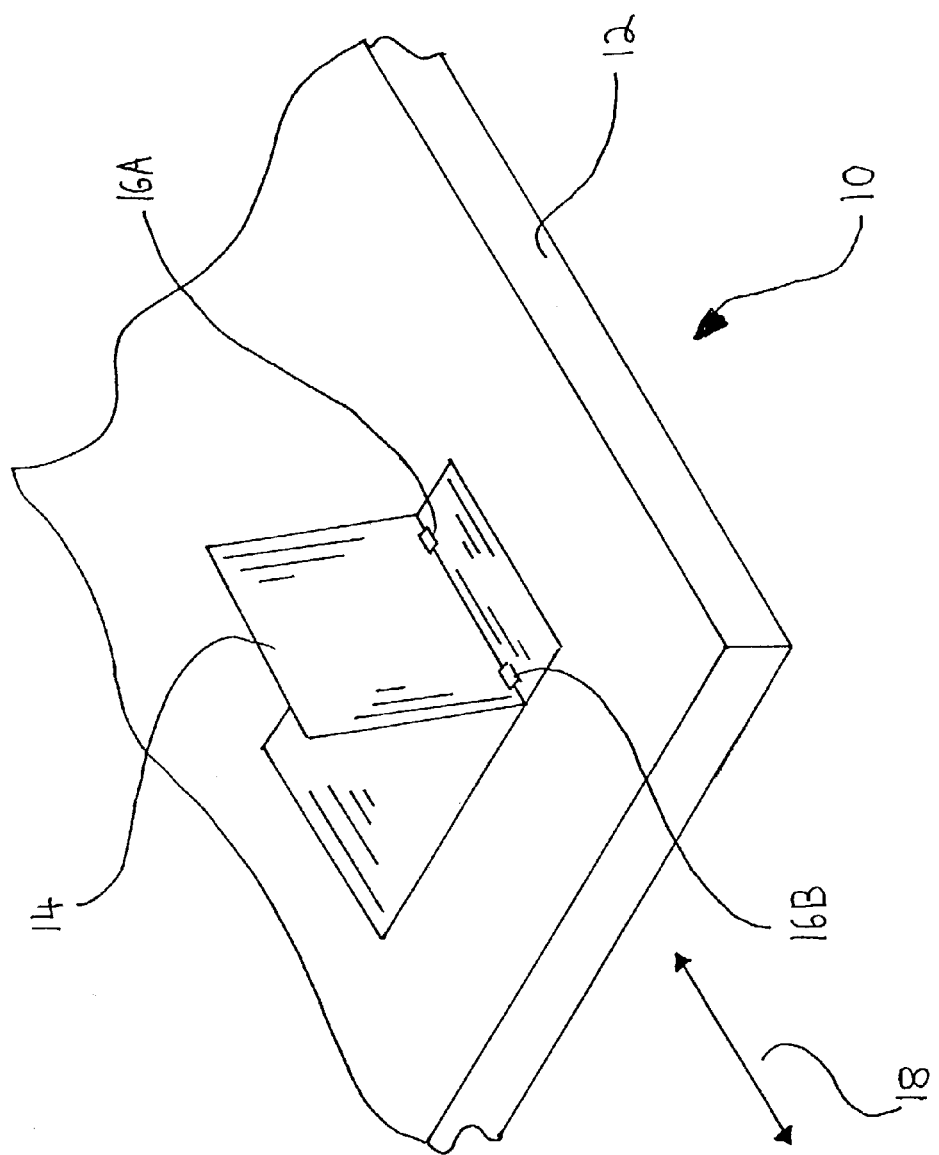
FIG. 1 is an isometric view of a micromachined structure comprising a hinged component.

Micromachined structures comprising functional and reliable hinges may be fabricated using various known micromachining methods. An example of a hinged micromachined structure 10 is depicted in FIG. 1. Hinged structure 10 includes one or more hinges 16A, 16B (collectively hinges 16). In the illustrated embodiment, hinges 16 permit positional and/or orientational adjustment of structure 10 by rotating component part(s) 14 of structure 10 about corresponding hinge axis 18. Currently, there are three commonly used micro-mechanical hinge structures: (i) torsion hinges; (ii) staple hinges; and (iii) scissor hinges. These hinge structures are described by K. S. J. Pister et al. in Micro-fabricated Hinges, Sensors & Actuators A, vol. 33, pp. 245-256 (1992), the content of which is hereby incorporated by reference.

For some embodiments of the invention, staple hinges may be preferred. However, the invention disclosed herein is suitable for use with any type of hinge, joint or other mechanism that allows a micromachined component (or portion thereof) to rotate off of and/or to be raised off of the surface of the substrate on which it is formed. Such hinges, joints or other mechanisms include, without limitation, prismatic joints, revolute joints and spherical joints. The specific embodiments of the invention described below use hinges, with the understanding that the invention may be applied to micromachined structures and components comprising any of the above described hinges, joints or mechanisms.

The choice of a particular hinge design will depend on a variety of factors, which may include, for example: the hinge's manufacturability, the robustness of a particular hinge design, the expense of a particular hinge design, the degrees of freedom required for a particular micromachined structure, or the like. Hinges used for the current invention may comprise stops to control a range of motion of the hinge and/or to prevent the hinge from jamming.

The methods of the invention involve adjusting the position(s) and/or orientation(s) of hinged components using electrostatic force(s) to assemble three-dimensional micromachined structures.

Figure 2A:
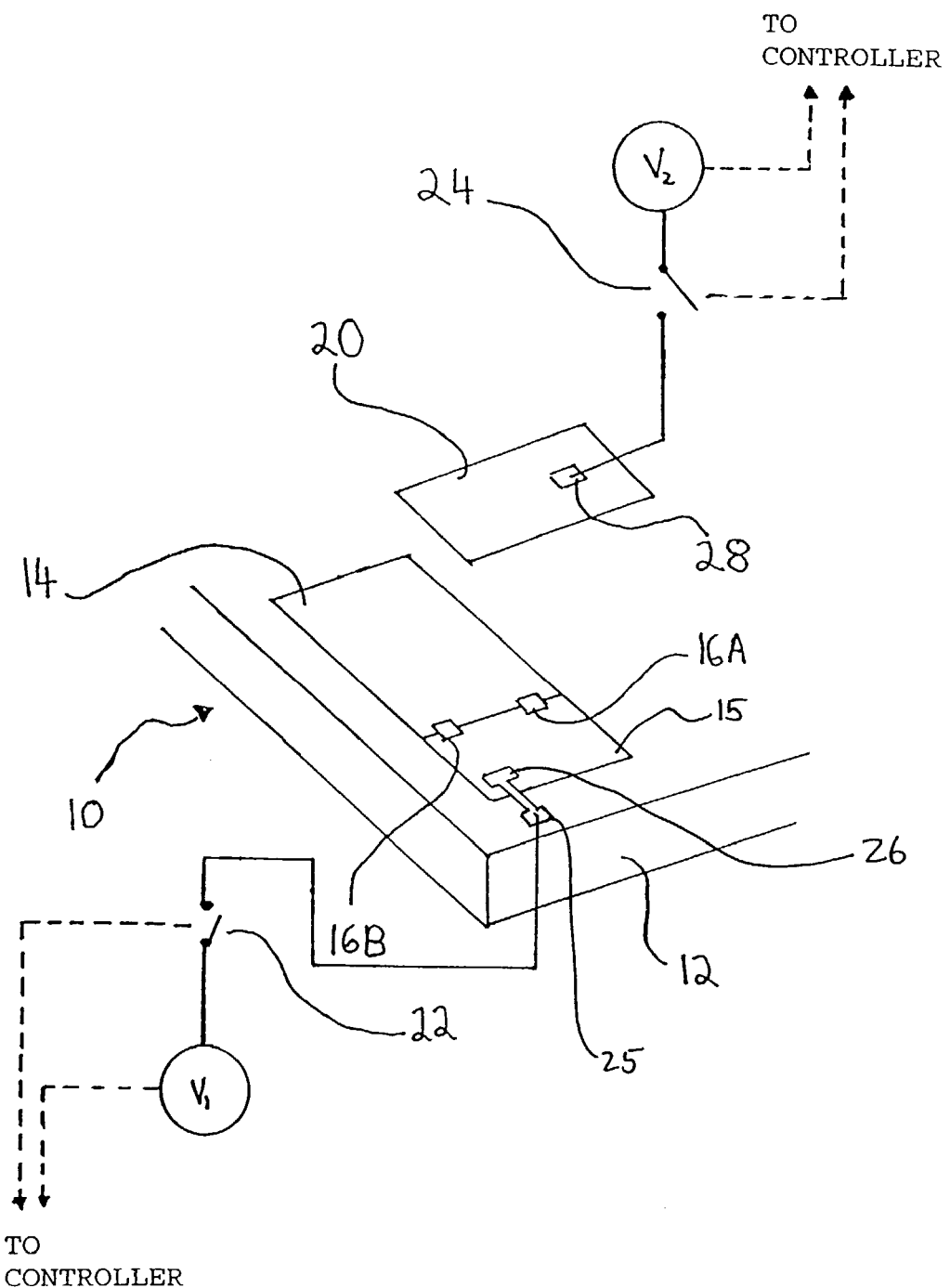
FIGS. 2A and 2B schematically illustrate a method of adjusting the position and/or orientation of a hinged micromachined structure according to a particular embodiment of the invention.
Figure 2B:
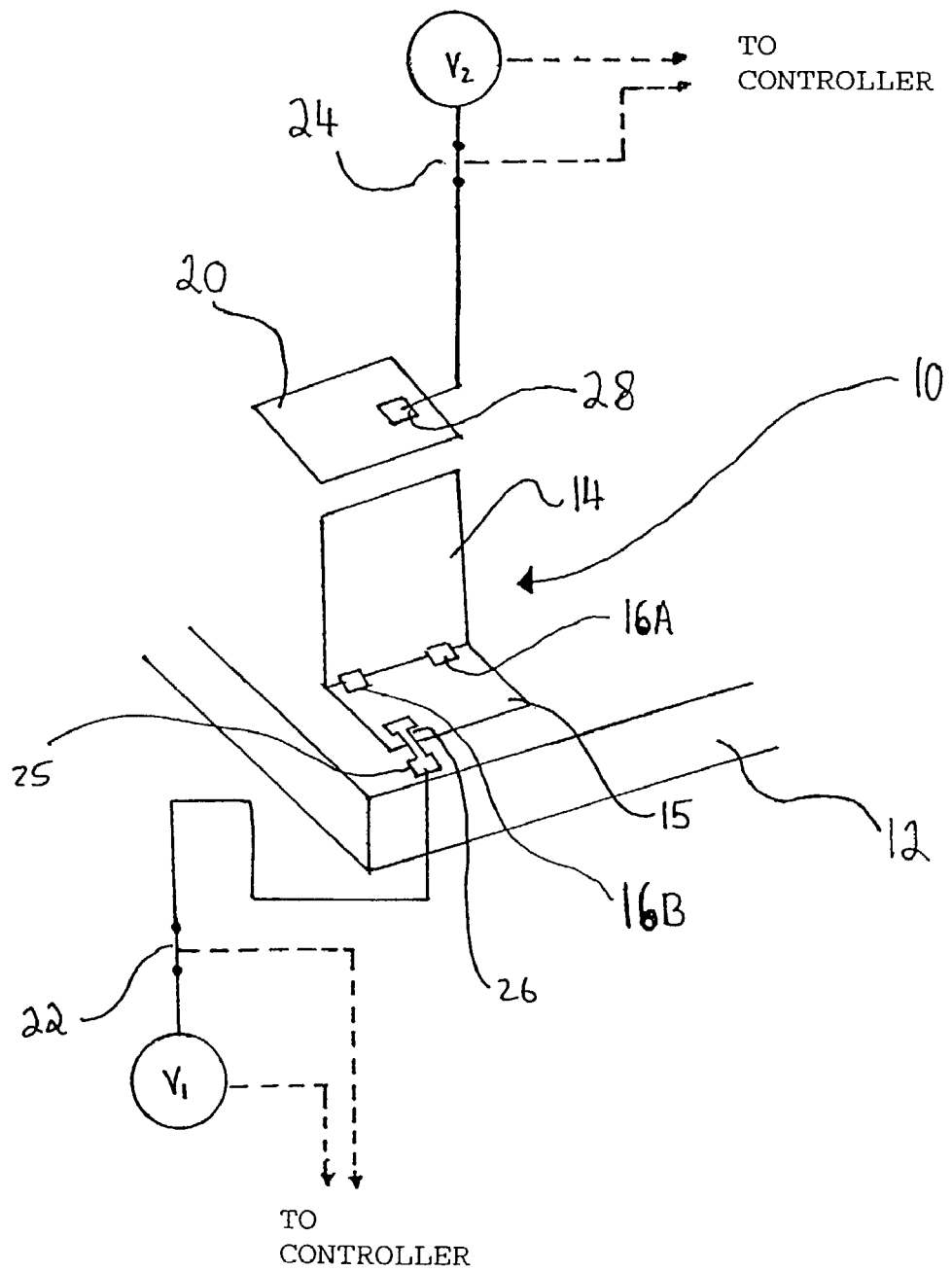

A particular embodiment of the invention is schematically depicted in FIGS. 2A and 2B. FIG. 2A depicts a hinged micromachined structure 10 on a substrate 12. Substrate 12 may be a semiconductor wafer, for example. Structure 10 has a pair of hinges 16A, 16B (collectively, hinges 16) and a moveable hinged component 14. The number of hinges 16 coupling hinged component 14 to substrate 12 may vary. Typically, but not necessarily, a micromachined structure includes two or more hinges for each hinged component.

An electrical connection 26 is provided to structure 10. Preferably, electrical connection 26 is provided to structure 10 through base portion 15. Electrical connections, such as connection 26, may comprise various types of electrical contacts and conductive paths including those that are well known in the microelectronics industry. Electrical connection 26 and its conductive path may be made, for example, from conductive materials such as doped polysilicon, metal, other doped semiconducting materials and the like. Electrical connection 26 may extend to a pad 25 on substrate 12 located in a position spaced apart from structure 10. Preferably, hinged component 14 and at least one of hinges 16 are fabricated from conductive material. In this manner, a voltage may be applied to hinged component 14 through electrical connection 26, base portion 15 and hinges 16.

A hinged micromachined component, such as component 14, might, for example, have dimensions on the order of 5 μm-1 mm. Preferably, hinged components have dimensions on the order of 20-500 μm.

A conductive surface 20 having electrical connection 28 is located (or moved into a location) in a vicinity of structure 10. Preferably, conductive surface 20 is substantially planar is positioned above structure 10 and is oriented substantially parallel to substrate 12.

In FIG. 2B, a first voltage $V_1$ is applied to hinged component 14 through electrical connection 26 and a second voltage $V_2$ is applied to surface 20 through connection 28. Voltages $V_1$ and $V_2$ are selected such that there is an attractive electrostatic force between surface 20 and component 14. If the attractive electrostatic force between component 14 and surface 20 is sufficiently high, component 14 is raised from substrate 12. As component 14 is raised, hinges 16 rotate about their hinge axis. In FIG. 2B, hinges 16 have pivoted such that component 14 is standing off of substrate 12. If surface 20 is substantially parallel with the surface of substrate 12 and the magnitude of the attractive electrostatic force is sufficiently high, then hinged component 14 will tend to move until it is substantially perpendicular to the substrate 12.

In the embodiment of FIGS. 2A and 2B, there are two voltage sources, $V_1$ and $V_2$. Voltage source $V_1$ applies a first potential to component 14 and voltage source $V_2$ applies a second potential to surface 20. It will be appreciated by those skilled in the art that voltages $V_1$, $V_2$ may be at positive, negative and/or ground potential while still providing the attractive electrostatic force described above. In a preferred embodiment (not shown), one voltage source $V_1$ is connected between surface 20 and component 14. In this manner, surface 20 may be at ground potential and a positive or negative potential may be applied to component 14 to create the attractive electrostatic force required to raise component 14 by rotating hinges 16.

In the illustrated embodiment, a controller (not shown) controls the application of the electrostatic force to component 14. In the embodiment of FIGS. 2A and 2B, the controller controls voltage sources $V_1$ and $V_2$ and corresponding switches 22 and 24. Such a controller may comprise a personal computer, an embedded microprocessor, a stand-alone processor, a combination of processors, manually operated switches or the like. Such a controller may be fabricated on substrate 12. Switches 22 and 24 may not be required.

The magnitude and direction of the electrostatic force applied to component 14 depend, at least in part, on: (i) the shapes of surface 20 and component 14; (ii) the difference between the applied voltages $V_1$, $V_2$; and (iii) the position of surface 20 relative to component 14.

The difference between voltages $V_1$, $V_2$ affects the magnitude of the electrostatic force acting on component 14. Accordingly, voltages $V_1$ and $V_2$ may be selected and/or varied to achieve certain results. For example, $V_1$ and $V_2$ may be selected to achieve: (i) a desired position and/or orientation of component 14 relative to substrate 12; (ii) a desired response time for the movement of component 14; and (iii) repetitive movements or motion of component 14.

More particularly, a non-vertical desired orientation of component 14 may be effected, for example, by controlling voltages $V_1$, $V_2$, such that there is only enough attractive electrostatic force to move component 14 to the desired orientation. A desired response time for the movement of component 14 from a first orientation (e.g. substantially parallel to substrate 12) to a second orientation (e.g. substantially perpendicular to substrate 12) may be achieved, for example, by controlling voltages $V_1$, $V_2$ such that the attractive electrostatic force is sufficient to achieve the desired response time.

It is generally convenient to provide a surface 20 which is much larger than component 14, is parallel to substrate 12 and is spaced as closely as practical to substrate 12 without being so close that it interferes with the motion of component 14.

The magnitude and direction of the electrostatic force acting on component 14 are also affected by the position of surface 20 relative to substrate 12 and, more particularly, component 14. If surface 20 is relatively close to component 14, the electrostatic force acting on component 14 will be greater than when surface 20 is relatively far from component 14. In addition, if surface 20 is positioned relatively close to a distal end of component 14 (i.e. an end of component 14 away from hinges 16), the torque exerted on hinges 16 will be greater than when surface 20 is relatively close to hinged end of component 14. The direction of the electrostatic force between surface 20 and component 14 depends on the relative orientations of surface 20 and component 14. Surface 20 may be positionable relative to substrate 12, structure 10 and/or component 14. For example, a means of relative movement (not shown) may be provided between substrate 12 and surface 20.

As with the control of voltages $V_1$, $V_2$, the position and/or orientation of surface 20 (relative to substrate 12 and component 14) may be selected and/or varied to achieve certain results. For example, the relative position of surface 20 and component 14 may be selected to achieve: (i) a desired position and/or orientation of component 14 relative to substrate 12; and (ii) a desired response time for the movement of component 14.

More particularly, a desired orientation of component 14 relative to substrate 12 may be effected, for example, by positioning surface 20 in a particular position relative to component 14 and orienting surface 20 in a particular manner. With such a configuration, the resultant electrostatic attraction force between component 14 and surface 20 can be made to move component 14 towards the desired orientation. A desired response time for the movement of component 14 from a first orientation (e.g. substantially parallel to substrate 12) to a second orientation (e.g. substantially perpendicular to substrate 12) may be achieved, for example, by positioning surface 20 sufficiently close to a distal end of component 14 such that the attractive electrostatic force is adequate to achieve the desired response time.

The method of the invention may be applied to assemble structures having a plurality of hinged components. FIG. 3 depicts the method of the invention being applied to a structure 50 having a plurality of hinged components 52, 54, 56, which are pivotally connected to substrate 58 by hinges 60, 62 and 64 respectively.

Figure 3A:
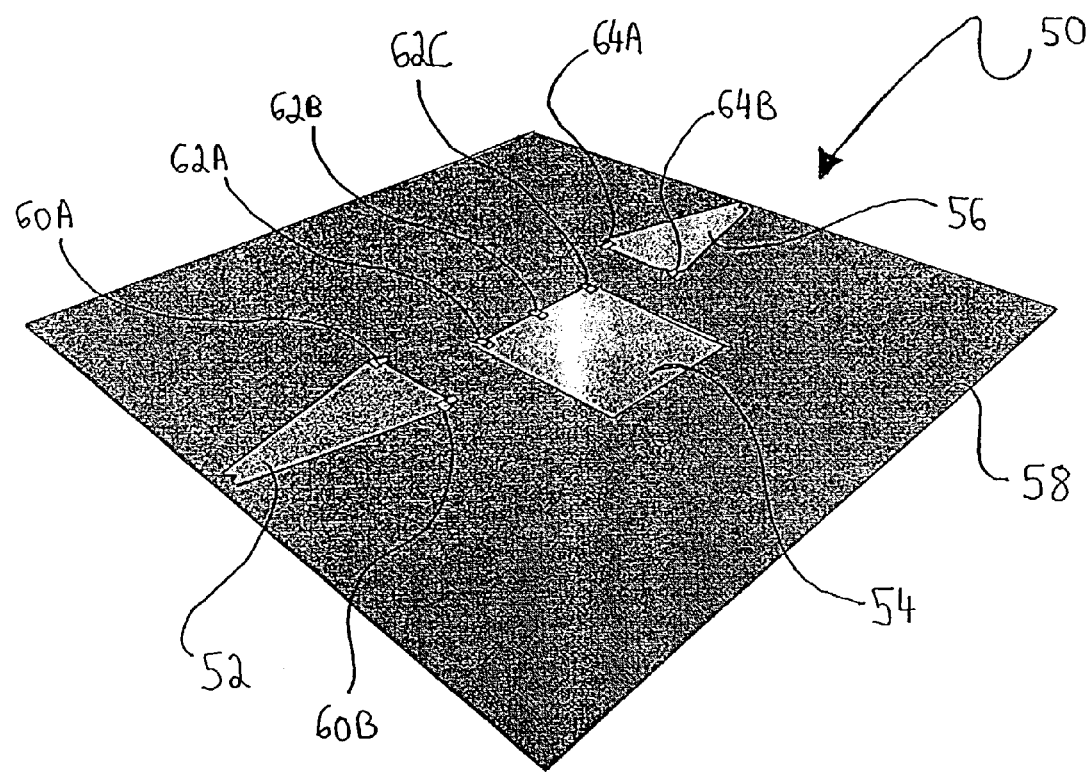
FIGS. 3A, 3B and 3C schematically illustrate a method of adjusting the positions and/or orientations of a plurality of hinged components to make a three-dimensional micromachined structure according to a particular embodiment of the invention.
Figure 3B:
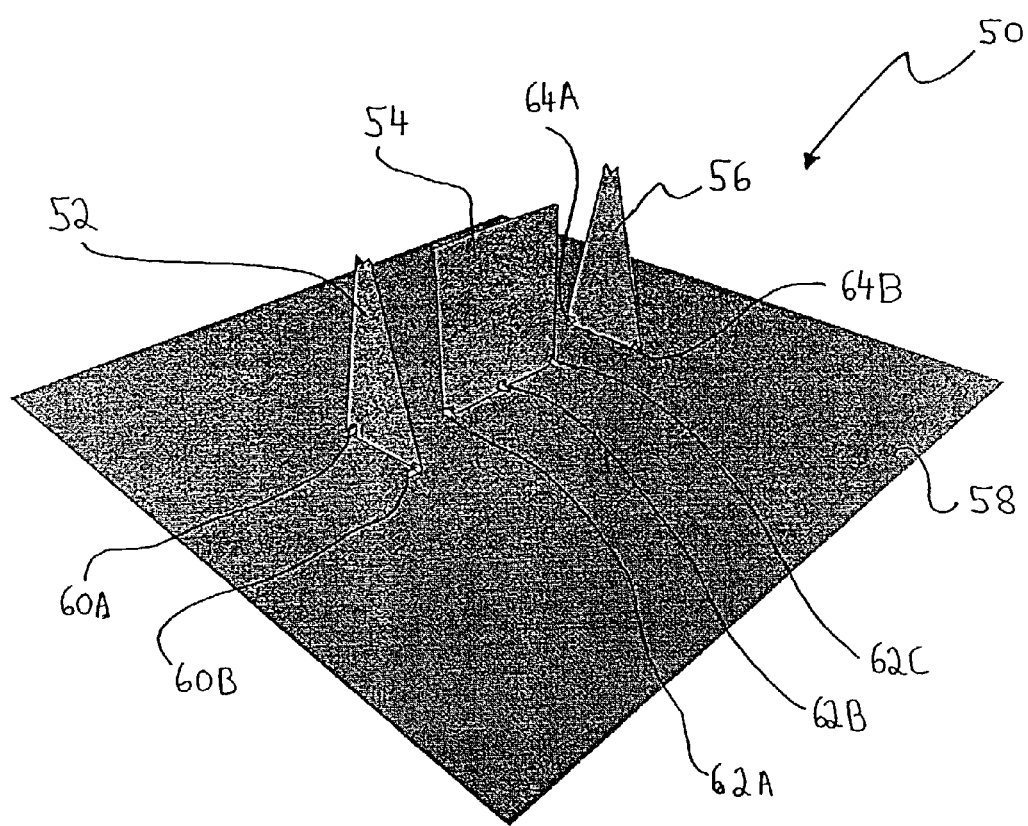

In FIG. 3A, multi-component structure 50 has not been raised and components 52, 54, 56 are at rest in the plane of substrate 58. In FIG. 3B, one or more conductive surfaces (not shown) are brought into the vicinity of components 52, 54, 56 and voltages are applied to components 52, 54, 56 so that potential difference exists between the components and to the conductive surface(s). Preferably, the voltage applied to the conductive surface(s) is a ground potential. The applied voltages result in electrostatic forces, which tend to raise components 52, 54, 56 by pivoting hinges 60, 62, 64 to draw components 52, 54, 56 away from substrate 58. Preferably, the conductive surface(s) are oriented substantially parallel to substrate 58 and the electrostatic forces between the conductive surface(s) and components 52, 54, 56 are sufficiently strong that components 52, 54, 56 move until they are substantially perpendicular to substrate 58 (as shown in FIG. 3B).

Preferably, in multi-component structures, such as structure 50 of FIG. 3, the voltage applied to each component 52, 54, 56 is independently controlled, such that the electrostatic forces applied to different components (or groups of components) may be individually varied. For example, each component 52, 54, 56 may be connected to a different controllable voltage source or each component 52, 54, 56 may be independently switched between any one of a plurality of voltage sources and/or a ground potential. In the case of the multi-component structure 50 illustrated in FIG. 3, it is preferable that there is only one conductive surface, which is used to raise all of components 52, 54, 56. However, in the general case, a plurality of conductive surfaces may be used for multi-component structures. Such conductive surfaces may be specific to adjust the position(s) and/or orientation(s) of certain individual hinged components or certain groups of hinged components.

In addition to raising the hinged components of micromachined structures from the surface of a substrate, the present invention comprises engaging selected components of multi-component structures with one another to support the multi-component structures in desired orientations. Engaging selected components with one another may involve positioning selected components by applying suitable voltages to the components and/or to the conductive surface(s) and pivoting the components about their hinges into positions and/or orientations where they engage with and support other components. In preferred embodiments of the invention the components are shaped to interfit with one another when arranged to form a three-dimensional structure.

Once the components 52, 54, 56 of a multi-component structure 50 are raised from substrate 58 as shown in FIG. 3B, the voltages applied to component(s) 52, 54, 56 may be controlled to create electrostatic attraction and/or repulsion between components 52, 54, 56. Such electrostatic forces between components 52, 54, 56 may be used to further adjust the positions and/or orientations of components 52, 54, 56 and to engage components 52, 54, 56, with one another to assemble the components into three-dimensional raised structures.

Figure 3C:
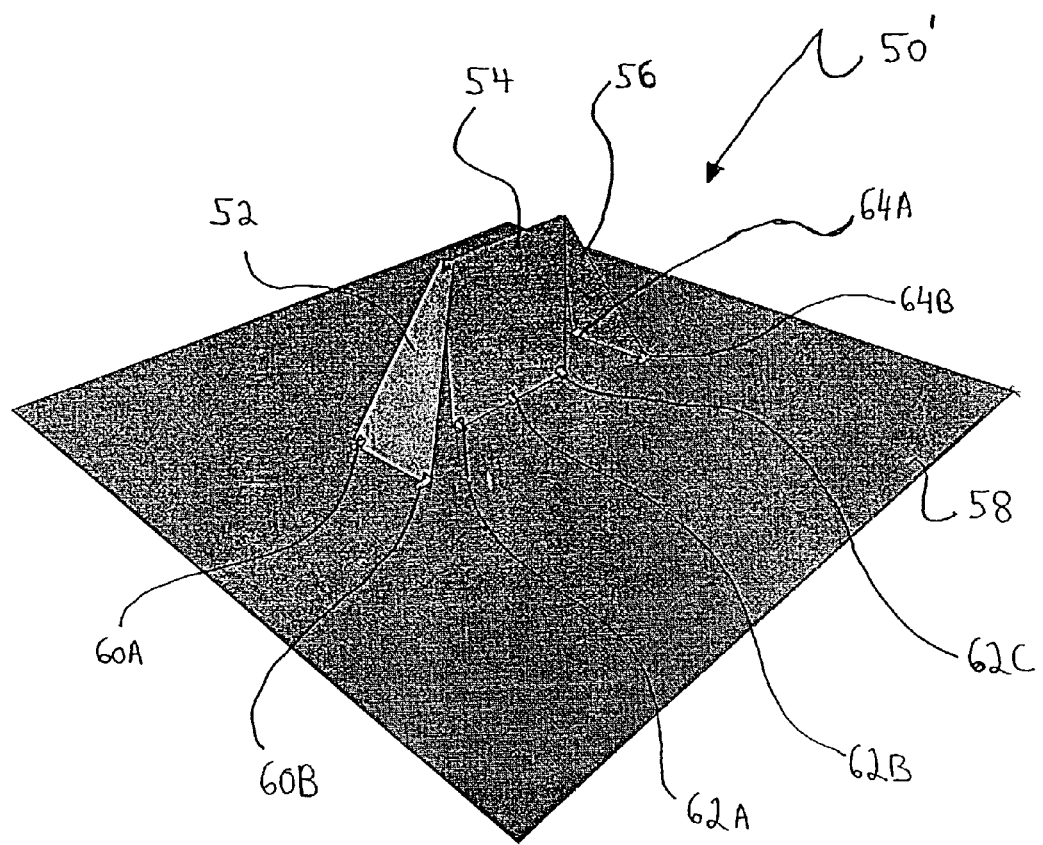

FIG. 3C depicts a three-dimensional raised structure 50' that results from creating an attractive electrostatic force between components 52, 54, 56 of structure 50 (FIG. 3B). Raised structure 50' may be created, for example, by imparting a positive voltage on brace components 52, 56 and a negative voltage on component 54 or, more generally, by importing any voltages which create a potential difference resulting in an attractive electrostatic force between brace components 52, 56 and component 54. Such an application of voltages causes brace components 52, 56 to be attracted to component 54, further pivoting components 52, 56 about hinges 60, 64 until brace components 52, 56 come into contact with and engage component 54.

Figure 4:
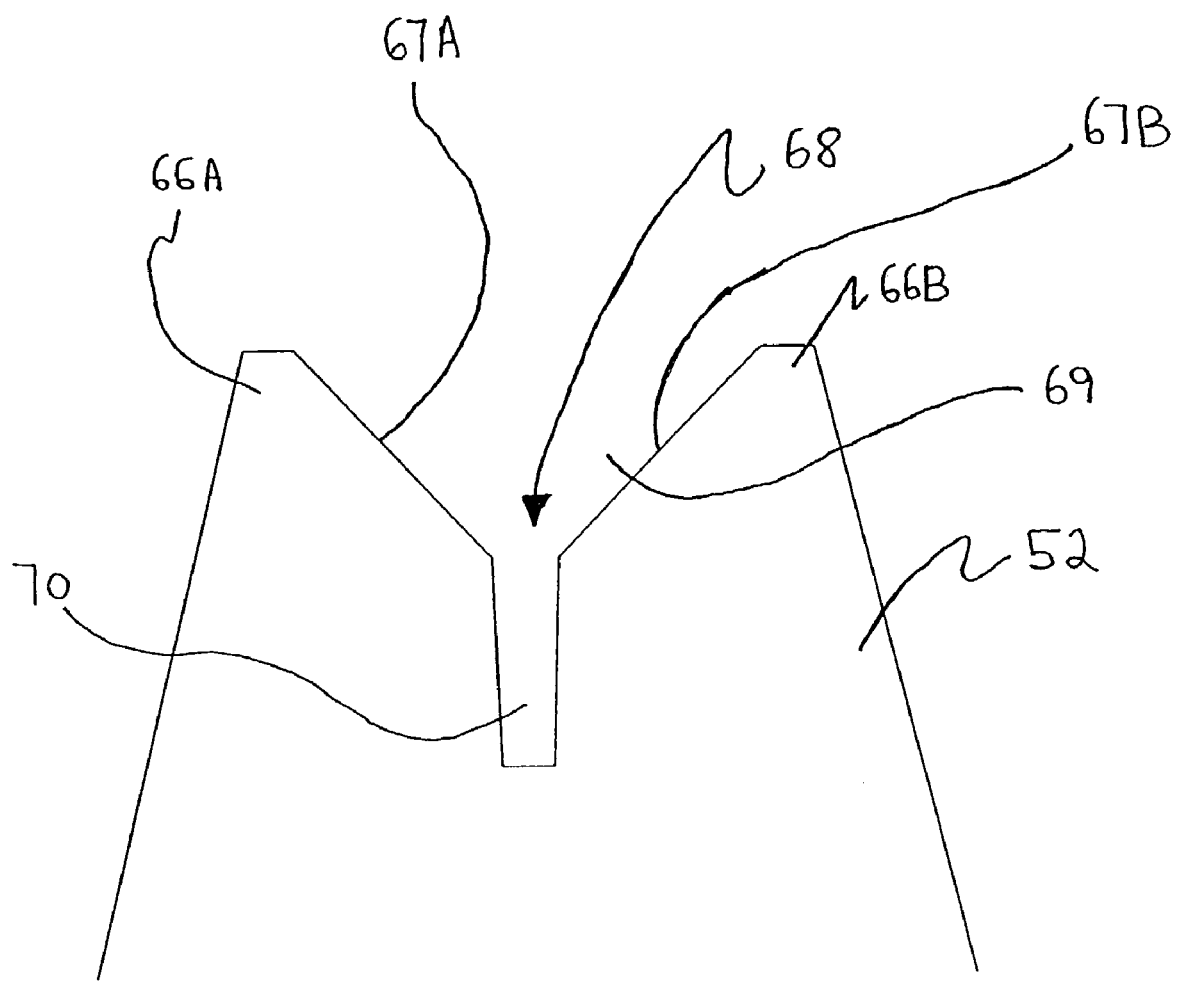
FIG. 4 is an elevated plan view of a mating portion of a brace component of the micromachined structure of FIG. 3.

Preferably, brace components 52, 56 are shaped as shown in FIG. 4. FIG. 4 depicts a brace component 52 having a generally "V-shaped" tip comprising protrusions 66A, 66B and slot 68. Preferably, slot 68 is bounded by angled surfaces 67A, 67B, so that slot 68 has a wider opening 69 at an outer end thereof and a narrower portion 70 at an inner end thereof. With this shape, protrusions 66A, 66B can project on either side of component 54 and an edge of component 54 can slide into slot 68 (see FIG. 3C). Preferably, narrow slot 70 is sized such that the width of narrow slot 70 corresponds approximately with the width of the edge of component 54.

Brace component 56 may be shaped similarly to brace component 52 (FIG. 4). Once the edges of component 54 are engaged with brace components 52, 56 by fitting into slots 68, raised structure 50' of FIG. 3C is relatively stable and mechanically self-supporting. Accordingly, the voltages may be removed from components 52, 54, 56 and the one or more conductive surfaces. Brace components 52, 56 support raised structure 50', preventing component 54 from falling down (i.e. by pivoting hinges 62). Hinges 60, 64 do not allow pivotal movement of brace components 52, 56 in a direction that would allow component 54 to fall down.

Optionally, when brace components 52, 56 are drawn towards component 54 (FIG. 3C), current may be allowed to flow between the components. Such current, if strong enough, may carry atoms from one or more components to the other component(s), creating a bridge of material that may fuse and connect the components together. For example, current may flow from brace components 52, 56 to component 54, fusing brace components 52, 56 to central component 54, such that the strength of structure 50' is increased. In other embodiments, it may be desirable to limit the current flow between components. This may be done, for example, by including current limiting circuitry on the voltage sources used in the invention.

Components of micromachined structures may have alternative or additional shapes that allow a portion (such as an edge or a tab) of one component to be received by (or to engage with) a portion of another component.

Component 54 (FIGS. 3A, 3B, 3C) may comprise a functional element (not shown). For example, component 54 may comprise an optical element, such as a lens, a mirror, a Fresnel zone plate, a half-wave plate, a quarter-wave plate, a reticle or a refractive lens. Such functional elements may be formed directly on component 54 during the fabrication of component 54 or may be mounted on component 54 after its fabrication. Other elements, such as sensors and transducers for example, may be mounted or formed on component 54.

In some embodiments of the invention, micromachined structures, similar to structure 50, 50' of FIGS. 3A, 3B, 3C, may be used to support objects, which may be, for example, optical components. In FIG. 5, a plurality of raised micromachined structures 80, 90, 100 support an optical fiber 110, so that fiber 110 is spaced apart from substrate 101. Structure 80 comprises a pair of brace components 82, 86 and a central component 84 that operate similarly to brace components 52, 56 and central component 54 of structure 50, 50' (FIGS. 3A, 3B, 3C). Similarly, structures 90 and 100 respectively comprise brace components 92, 96 and 102, 106 and central components 94 and 104. Each of central components 84, 94, 104 comprises a cut-out section 88, 98, 108, with a concave shape for receiving and holding optical fiber 110. It will be appreciated that similar apparatus may comprise a different number of micromachined structures. In addition or in the alternative, similar apparatus may comprise various modifications to the shape of central components 84, 94, 104 which allow the apparatus to receive, hold and/or support other objects. Such modifications may include, for example: changes to the size and/or shape of cut-out sections 88, 98, 108 and/or the addition of projecting sections of various size and shape (not shown) to components 84, 94, 104.

Figure 6A:
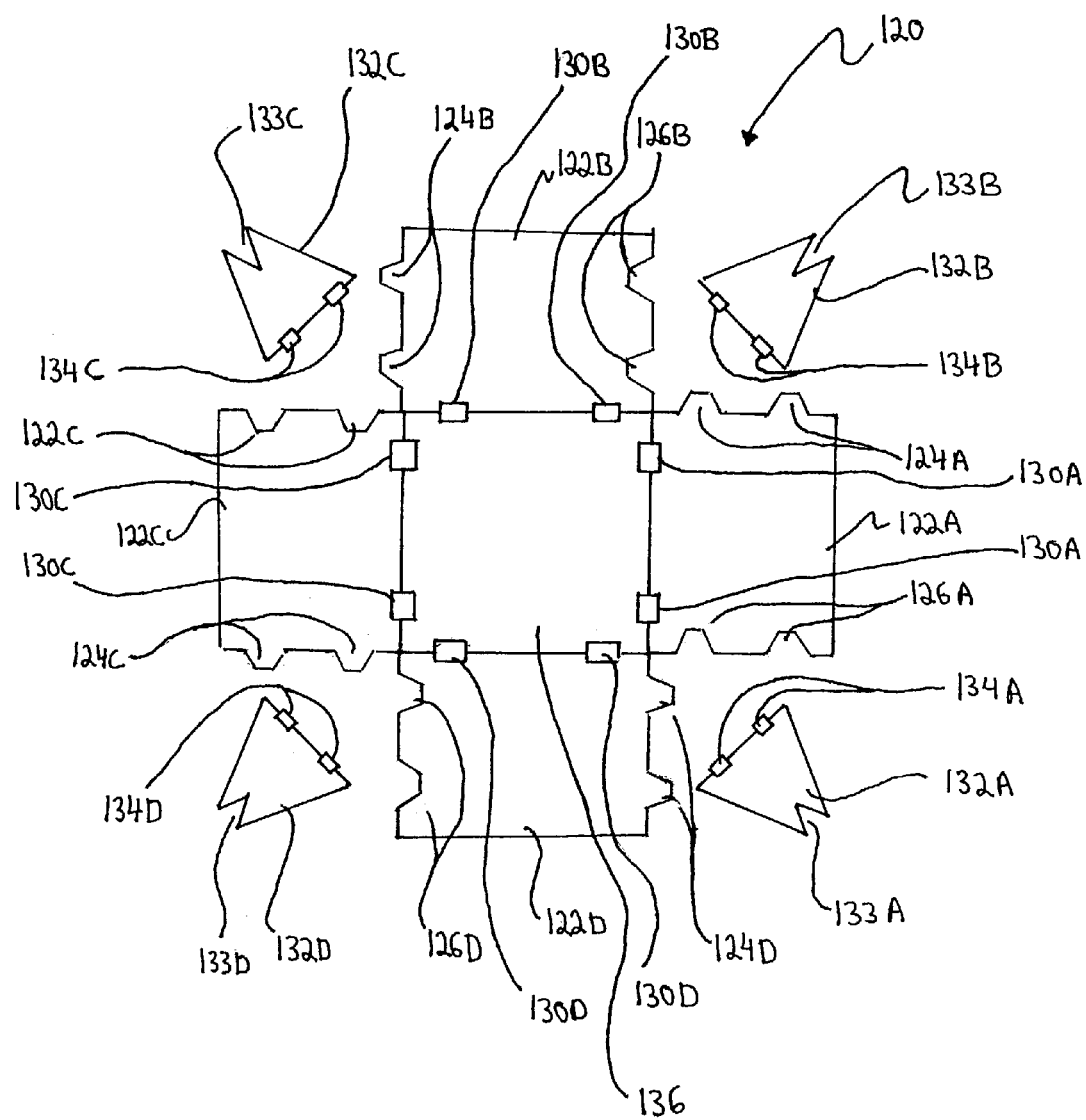
FIGS. 6A and 6B show how the method of the invention may be used to make a raised cuboid structure.
Figure 6B:
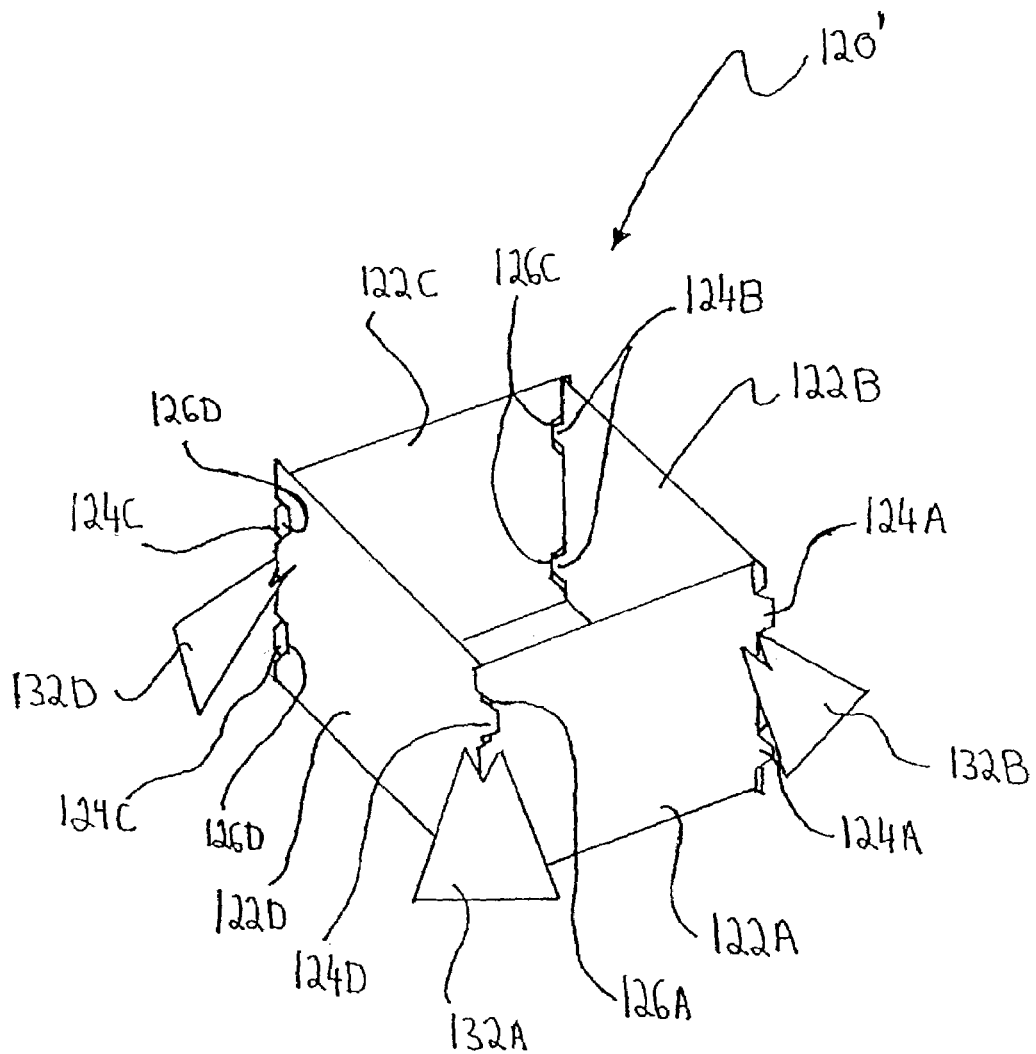

FIGS. 6A and 6B show how the method of the invention may be used to assemble a multi-component structure 120 (FIG. 6A) into a cuboid raised structure 120' (FIG. 6B). Multi-component structure 120 comprises four side components 122A, 122B, 122C, 122D (collectively, 122), each of which is pivotally coupled to substrate 136 by a plurality of hinges 130. Each side component 122 comprises a plurality of tabs 124 which project from a first side thereof and a plurality of notches 126 at an opposing side thereof. In the illustrated embodiment, multi-component structure 120 also comprises four brace components 132A, 132B, 132C, 132D (collectively, 132), each of which is pivotally coupled to substrate 136 by a plurality of hinges 134. Each brace component 132 comprises a generally "V-shaped" slot 133 on an edge opposite hinges 134.

Cuboid raised structure 120' (FIG. 6B) may formed by imparting voltages on side components 122, so that side components 122 are electrostatically attracted to at least one conductive surface (not shown) in a location proximate to multi-component structure 120. Preferably, the voltage applied to the conductive surface(s) is a ground potential. Such an electrostatic attraction causes side components 122 to pivot away from substrate 136 at hinges 130. Preferably, the conductive surface(s) are substantially planar and are oriented substantially parallel to substrate 136, such that side components 122 are drawn towards an orientation perpendicular to substrate 136. As side components 122 approach an orientation perpendicular to substrate 136, tabs 124 of each side component 122 project into notches 126 of an adjacent side component 122 and notches 126 of each side component 122 receive tabs 124 of an adjacent side component 122. The voltages on adjacent ones of side components 122 may be set so that when side components 122 are standing up, adjacent side components 122 are electrostatically attracted to one another.

In the illustrated embodiment, brace components 132 are raised from substrate 136 using a similar procedure (i.e. by imparting voltages on brace components 132 and on one or more conductive surfaces (not shown) that are positioned in a location proximate to brace components 132). Preferably, the voltage applied to the conductive surface(s) is a ground potential. The different voltages applied to brace components 132 and the conductive surface(s) create an electrostatic attraction which tends to raise brace components 132 away from substrate 136 by pivoting hinges 134. Preferably, the conductive surface(s) are substantially planar and are oriented substantially parallel to substrate 136, such that brace components 132 approach an orientation that is substantially perpendicular to substrate 136. The conductive surface(s) used to raise brace components 132 may be the same conductive surface(s) used to raise side components 122. Alternatively, different conductive surface(s) may be used for each of brace components 132 and side components 122.

After side components 122 and brace components 132 are both raised, voltage differences (not shown) may be applied between side components 122 and brace components 132 to create electrostatic attraction that attracts brace components 132 towards side components 122, as shown in FIG. 6B. For example, a positive voltage may be applied to side components 122 and a negative voltage may be applied to brace components 132. More generally, any voltages may be applied to side components 122 and brace components 132 to create a potential difference resulting in an attractive electrostatic force therebetween. In this manner, brace components 132 are drawn towards and engage with side components 122, such that the corners formed by adjacent pairs of side components 122 are received in slots 133 of brace components 132. Cuboid raised structure 120' is thereby supported in a relatively stable orientation. After the corners formed by adjacent side components 122 are firmly engaged in slots 133 of brace components 132, raised structure 102' may be mechanically self-supporting, such that the voltages may be removed from components 122, 132 and from the conductive surface(s).

Brace components 132 may be raised from substrate 136 simultaneously with side components 122. Alternatively, side components 122 may be raised during a first step and brace components 132 may be raised during a second step. During the first step, the same voltages may be applied to the conductive surface(s) and to brace components 132, while the voltages applied to side components 122 are selected to cause electrostatic attraction between the conductive surface(s) and side components 122. The lack of voltage difference between the conductive surface(s) and brace components 132 during the first step ensures that brace components 132 remain substantially unraised (i.e. oriented substantially in the plane of substrate 136), while side components 122 are raised as described above.

During the second step, the voltages applied to brace components 132 are switched, such that an electrostatic attraction force is created between the conductive surface(s) and brace components 132 and brace components 132 are raised from substrate 136 as described above. The first and second steps may occur at least partially contemporaneously with one another. In a third step, the voltages between side components 122 and brace components 132 may be altered, such that there is an electrostatic attraction which pulls brace components 132 toward the corners of side components 122 and engages brace components 132 with side components 122 as described above. Preferably, during the third step, the voltages of brace components 132 and the conductive surface(s) are maintained at the same level, such that brace components 132 are attracted only to side components 122.

In some embodiments (not shown), one of side components 122 may comprise a plurality of hinged axes. In this manner, a lid may be formed for cuboid structure 120'. For example, a side component 122 having two hinged axes may be raised to a vertical orientation by applying voltages to the component and to conductive plate(s) as described above and rotating the component about a first hinged axis. Once erected to a substantially vertical position, further voltages may be applied to selective part(s) of the component to rotate the part(s) of the component about the second hinged axis. This rotation about the second hinged axis may be used to form a lid for cuboid raised structure 120'.

Although the embodiment depicted in FIGS. 6A and 6B and described above describes raised structure 120' as "cuboid", those skilled in the art will appreciate that a raised structure having a shape resembling any parallelepiped may be constructed in accordance with the technique described above.

Figure 10:
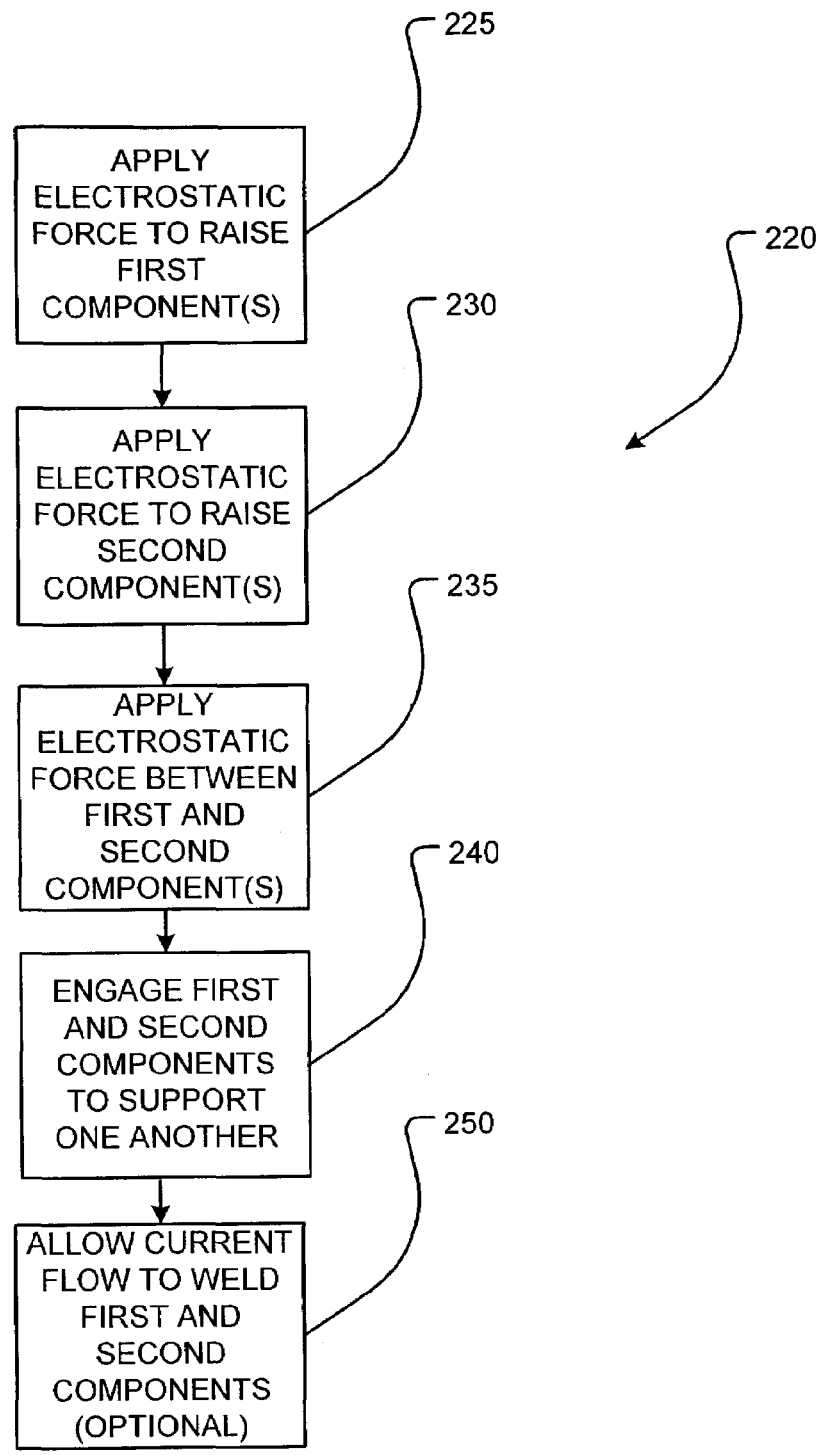
FIG. 10 is a schematic block diagram depicting a method for making a three-dimensional structure according to a particular embodiment of the invention; and, FIGS. 11A-11F show a particular technique for fabricating a hinge which may be used to form a hinged micromachined component.

FIG. 10 shows a schematic block diagram of a method 220 for making a three-dimensional structure in accordance with a particular embodiment of the invention. Method 220 may be applied to a variety of multi-component structures, such as the structure 50, 50' depicted in FIGS. 3A, 3B and 3C or structure 120, 120' depicted in FIGS. 6A and 6B, for example. Method 220 begins in block 225, where a first electrostatic force is applied to a first component (or a first group of components) to raise the first component(s) from the plane of the substrate. For example, such a first electrostatic force may be used to raise component 54 (FIG. 3A) or side components 122 (FIG. 6A).

In block 230, a second electrostatic force is applied to a second component (or a second group of components) to raise the second component(s) from the plane of the substrate. A second electrostatic force may be used, for example, to raise brace components 52, 56 (FIG. 3B) or brace components 132 (FIG. 6B). The illustrated embodiment depicts block 230 as occurring subsequent to block 225. In some embodiments, however, the application of electrostatic force in block 230 may occur at least partially contemporaneously with the application of electrostatic force in block 225.

In block 235, a third electrostatic force is applied between the first component (or first group of components) and the second component (or second group of components). Typically, this third electrostatic force is an attractive force which tends to attract the second component(s) toward the first component(s). The third electrostatic force may be created by applying a first voltage to the first component(s) and a second voltage to the second component(s). For example, in the embodiment of FIG. 3B, an attractive electrostatic force may be created by applying a first voltage to component 54 and a second voltage to brace components 52, 56. Similarly, in the embodiment of FIG. 6B, an attractive electrostatic force may be created by applying a first voltage to side components 122 and a second voltage to brace components 132.

In block 240, the first and second component(s) are engaged with one another to support one another in a desired orientation. In the embodiment of FIG. 3C, for example, brace components 52, 56 engage an edge of component 54 to support component 54 in a substantially upright orientation. In the embodiment of FIG. 6B, brace components 132 engage and support the corners of two adjacent side components 122.

In block 250, the first and second components are optionally welded together by causing an electrical current to flow between the first and second components.

In some embodiments of method 220, the procedures of blocks 230 and/or 235 may not be required. For example, the movement of the first component(s) may mechanically cause a corresponding movement of a second component (or group of second components). Such mechanical movement may result in the second component(s) being moved into position (s) where they engage and support the first component(s) in a desired orientation. Such an embodiment is described below in FIGS. 7A-7D.

Figure 7A:
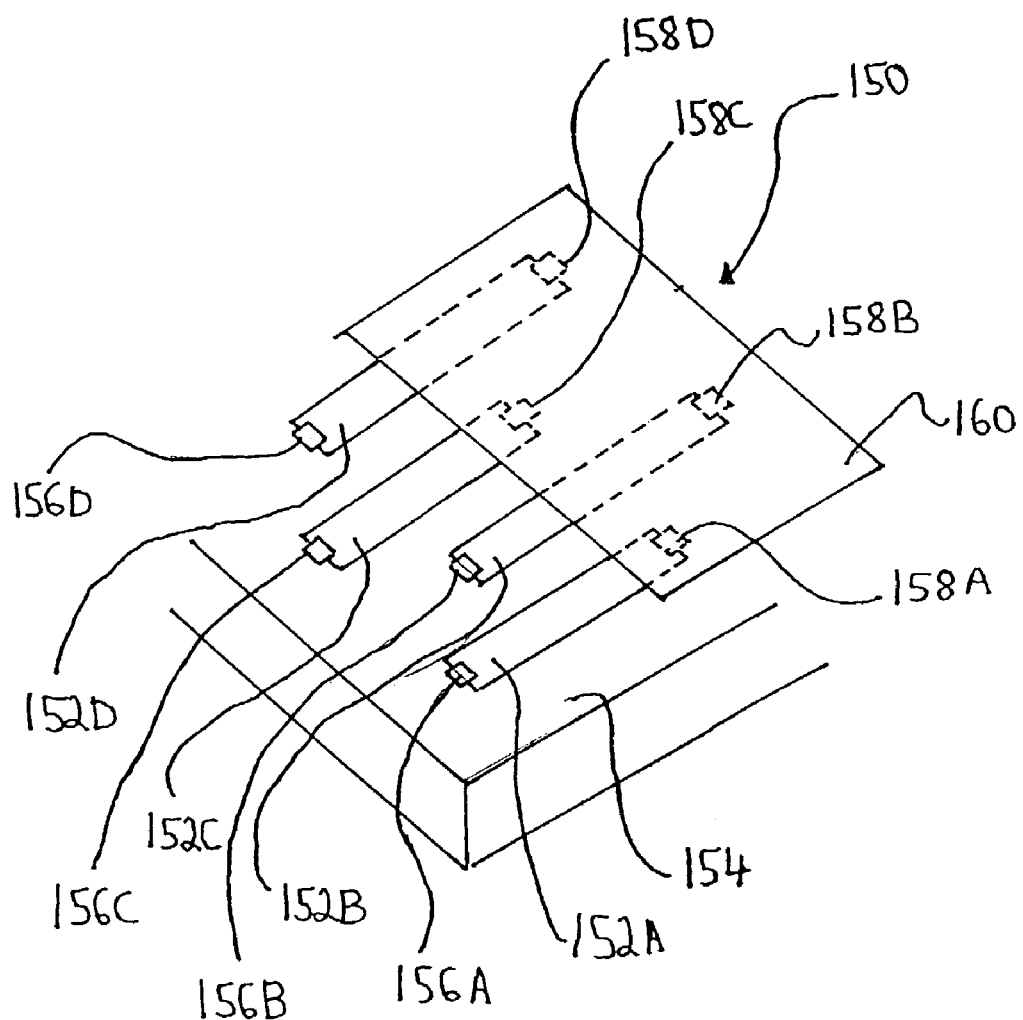
FIGS. 7A and 7B show how the method of the invention may be used to make a raised platform.
Figure 7B:
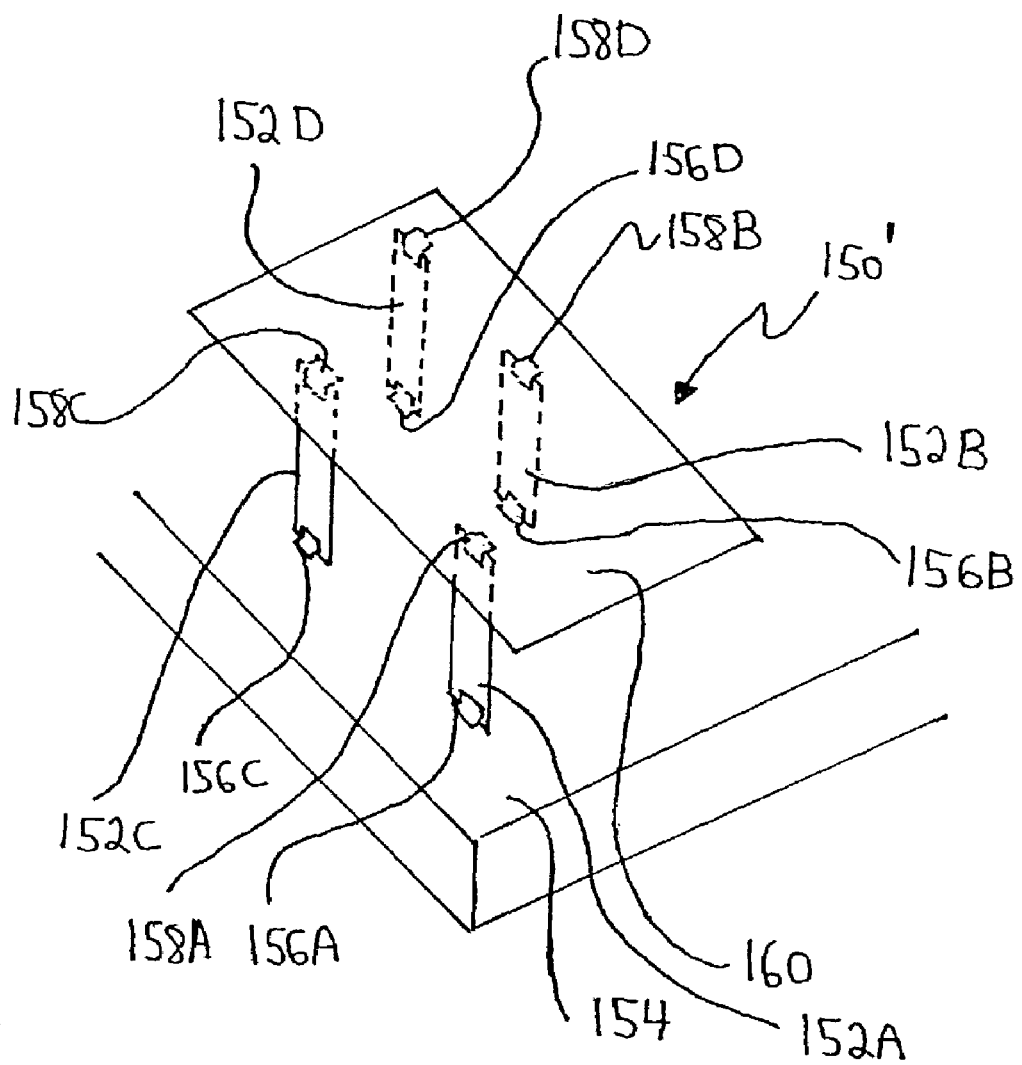

FIGS. 7A and 7B show how the method of the invention may be used to assemble multi-component structure 150 (FIG. 7A) into raised platform structure 150' (FIG. 7B). Multi-component structure 150 comprises a platform component 160 and plurality of leg components 152. Each leg component 152 comprises a first hinge 156 pivotally connecting leg component 152 to substrate 154 and a second hinge 158 pivotally connecting leg component 152 to platform component 160.

Raised platform structure 150' is formed by positioning one or more conductive surfaces (not shown) above substrate 154 in the vicinity of platform component 160 and applying voltages to both the conductive surface(s) and the platform component 160 to create an electrostatic attractive force between platform component 160 and the conductive surface(s). A voltage may be applied to platform component 160 through leg components 152, which may be fabricated to be suitably conductive. The electrostatic attractive force between the conductive surface(s) and platform component 160 causes platform component 160 to raise from substrate 154 by pivoting at each of hinges 156 and 158. Preferably, the embodiment depicted in FIGS. 7A and 7B comprises one conductive surface that is substantially planar in shape and oriented parallel to substrate 154, so that leg components 158 achieve an orientation that is substantially perpendicular to substrate 154 and platform component 160 achieves an orientation that is substantially parallel to substrate 154.

Figure 7C:
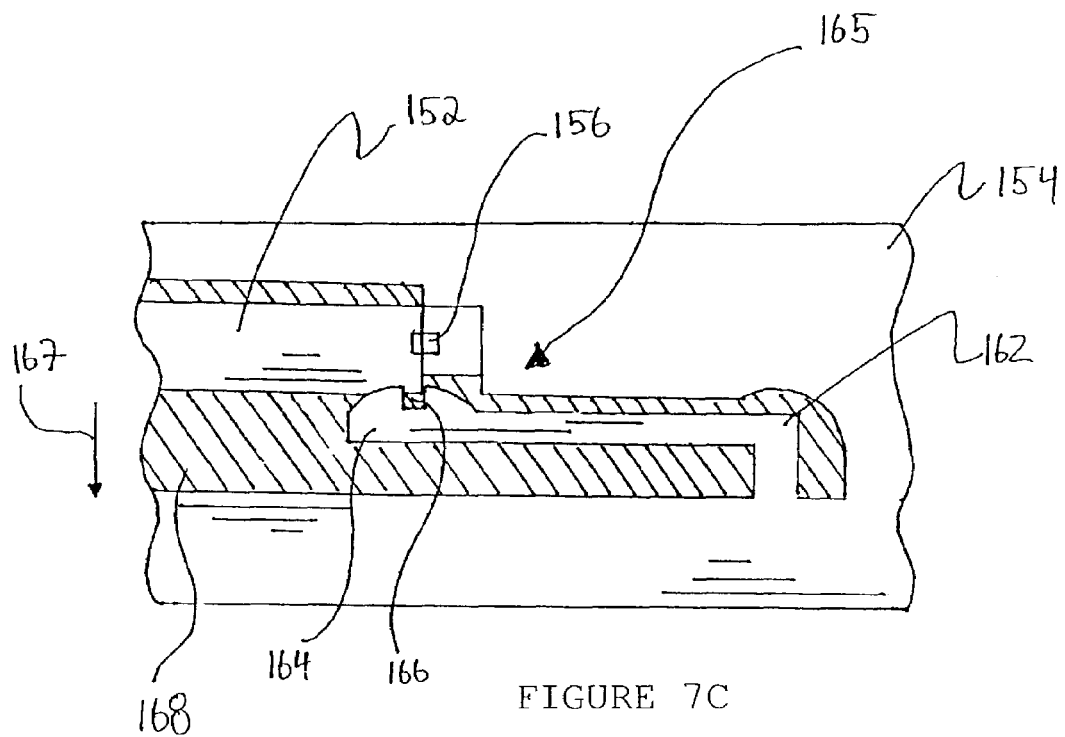
FIGS. 7C and 7D depict a particular embodiment of a mechanical support mechanism which may be used, inter alia, to support the raised platform of FIGS. 7A and 7B.
Figure 7D:
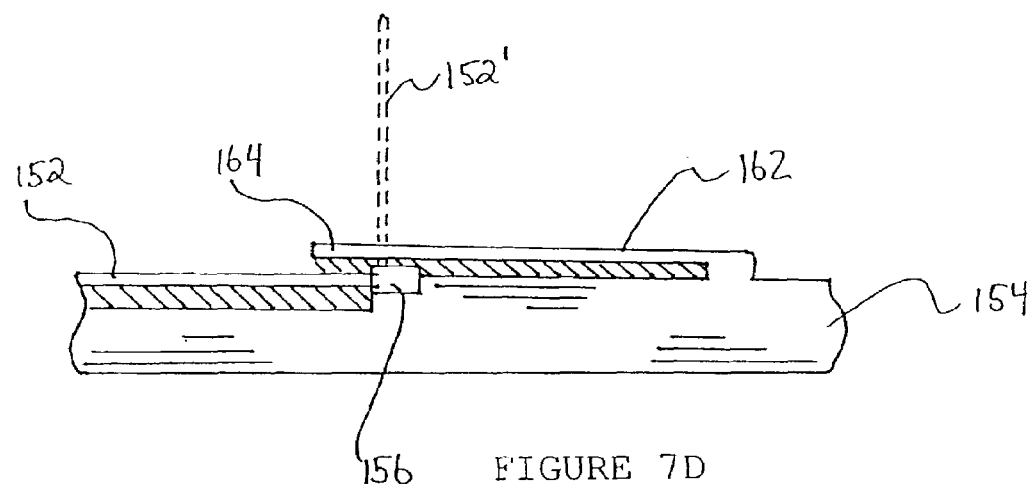

FIGS. 7C and 7D show respectively a top view and a side sectional view of a mechanism 165 for supporting leg component 152 in an upright position 152'. Mechanism 165 comprises a cantilevered component 162 that is suspended over recess 168. Cantilevered component 162 comprises a distal end 164 having a notch 166. When leg component 152 is not raised, the distal end 164 of cantilevered component 162 is suspended over top of leg component 152. However, as leg component 152 is raised, leg component 152 pushes against the distal end 164 of cantilevered component 162, displacing distal end 164 in the general direction of arrow 167. When leg component 152 is sufficiently erect, one of its edges is received into notch 166, allowing the distal end 164 of cantilevered component 162 to move back towards its original position (i.e. by moving in a direction generally opposed to arrow 167). When an edge of leg component 152 is received in notch 166, it is mechanically supported in its upright orientation 152'.

Figure 7E:
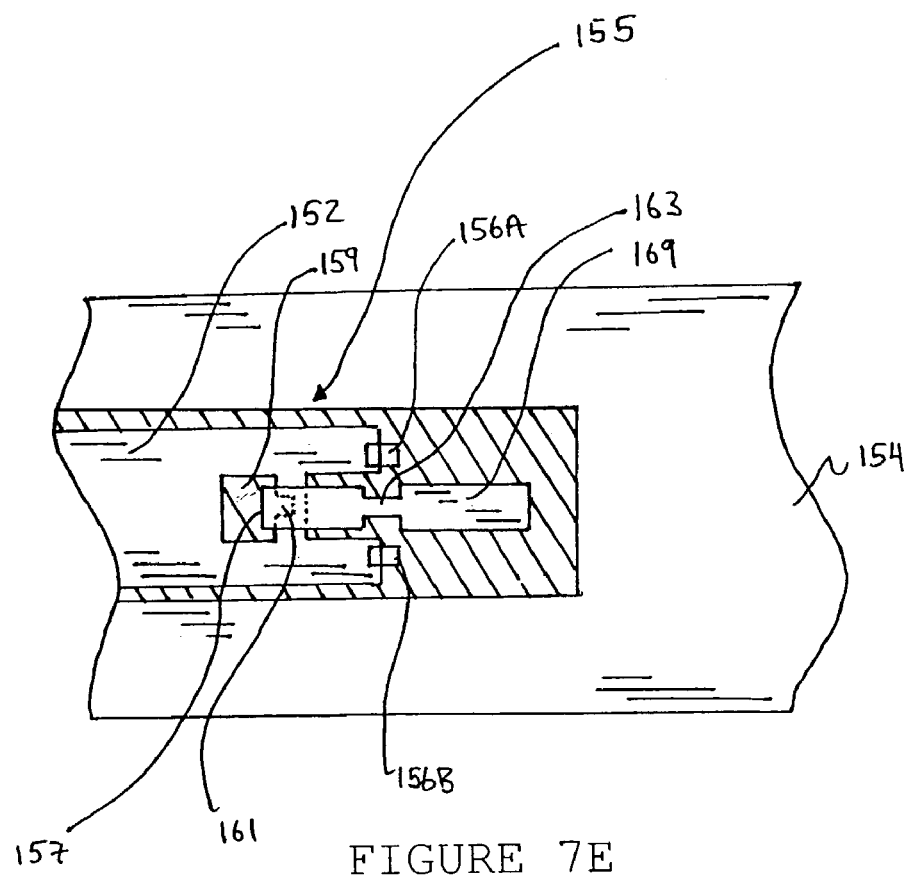
FIGS. 7E and 7F depict an alternative embodiment of a mechanical support mechanism which may be used, inter alia, to support the raised platform of FIGS. 7C and 7D.
Figure 7F:
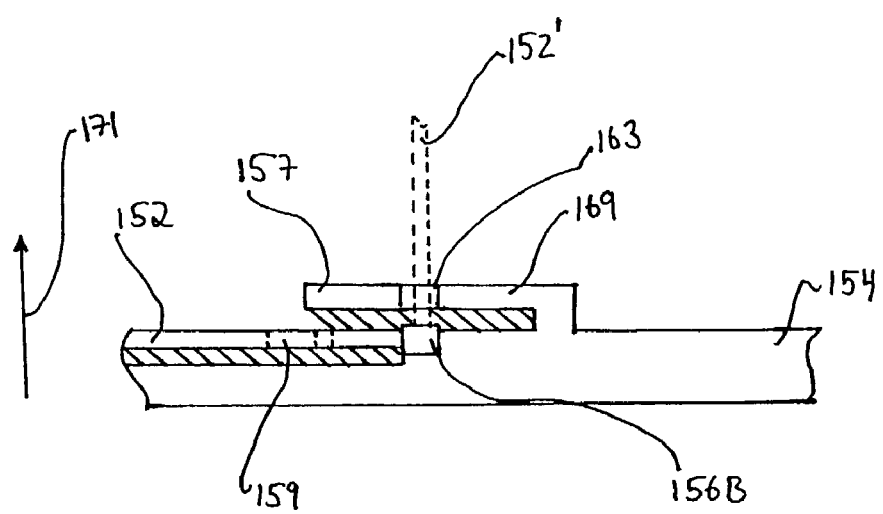

FIGS. 7E and 7F show respectively a top view and a side sectional view of a mechanism 155 for supporting leg component 152 in an upright position 152'. Mechanism 155 comprises a cantilevered component 169 supported at one end by substrate 154 and having a distal end 157. Cantilevered component 169 has a notch 163 between its two ends. In the illustrated embodiment, leg component 152 has a pair of hinges 156A and 156B and is pierced by an aperture 159 having a notch 161 on one edge thereof. When leg component 152 is not raised, the distal end 157 of cantilevered component 169 is suspended over top of leg component 152. However, as leg component 152 is raised, distal end 164 of cantilevered component 162 penetrates aperture 159. As leg component 152 continues to be raised, the distal end 164 of cantilevered component 169 may be displaced in the general direction of arrow 171. When leg component 152 is sufficiently erect, notches 161 and 163 engage one another, allowing the distal end 157 of cantilevered component 169 to move back towards its original position (i.e. by moving in a direction generally opposed to arrow 171). When notches 161 and 163 are engaged, leg component 152 is mechanically supported in its upright orientation 152'.

Locking mechanism 165 (of FIGS. 7C and 7D) and locking mechanism 155 (of FIGS. 7E and 7F) represent only two embodiments of mechanisms for mechanically supporting components in various desired orientations. Those skilled in the art will appreciate that there are many similar mechanical mechanisms to support moveable component(s) in desired orientations. Other mechanical support mechanisms may be used with the multi-component structure 150 of FIG. 7. In addition, mechanisms similar to mechanism 165 (of FIGS. 7C and 7D) and mechanism 155 (of FIGS. 7E and 7F) and/or other mechanical support mechanisms may be used in conjunction with the other three-dimensional structures described herein.

Figure 8A:
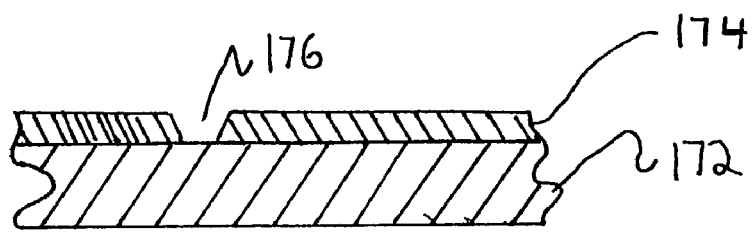
FIGS. 8A, 8B and 8C show a particular technique for fabricating a micromachined structure.
Figure 8B:
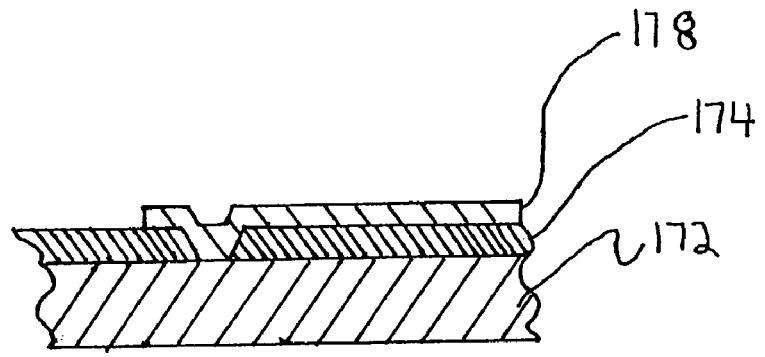

FIGS. 8A and 8B show a cross-sectional view of an example of a type of process for the fabrication of a micromachined component 170 on a substrate 172. The technique shown in FIG. 8 is referred to as a "surface micromachining" process or a "thin film" process. The invention should be understood to include other micromachining fabrication processes, such as bulk micromachining, which could also potentially be used to fabricate hinged structures.

FIG. 8A shows a substrate 172, which is typically a single crystal silicon wafer. Other materials, such as GaAs-based materials for example, could be used to form substrate 172. Preferably, substrate 172 is electrically insulating or is coated with an insulating material (not shown). A sacrificial layer 174 is grown on substrate 172. In typical micromachining fabrication processes, sacrificial layer 174 is formed by chemical vapor deposition (CVD) or physical vapor deposition (PVD). Sacrificial layer 174 may also be deposited using other techniques known to those skilled in the art, such as spin-on deposition and sol-gel deposition, for example. Sacrificial layer 174 may comprise a plurality of layers of different materials. After sacrificial layer 174 is deposited, one or more anchor points 176 may be patterned into sacrificial layer 174. Anchor points may extend partially or completely through sacrificial layer 174.

Figure 8C:
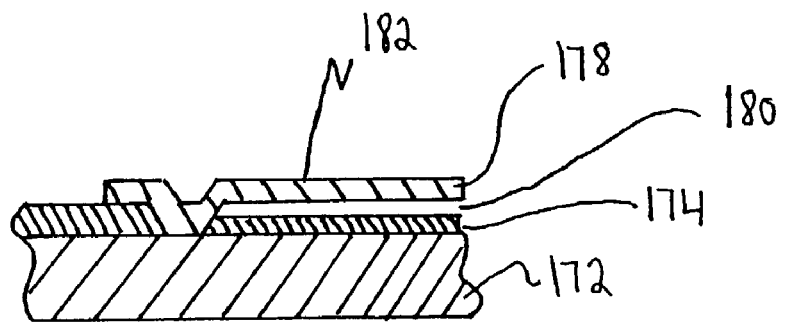

In FIG. 8B, a thin film of polysilicon 178 is deposited onto sacrificial layer 174 in what will eventually become a structural layer 178. Polysilicon layer 178 is conductive or can be made conductive by subsequent doping and will eventually form the moveable component. As shown in FIG. 8B, when polysilicon layer 178 is formed, it is completely attached to sacrificial layer 174. In some embodiments, materials other than polysilicon may be used to form structural layer 178. In FIG. 8C, a region 180 is etched or otherwise removed from sacrificial layer 174. The removal of region 180 releases a portion of structural layer 178 from sacrificial layer 174, allowing movement of component 182 relative to substrate 172 and sacrificial layer 174. In the illustrated embodiment, only a portion of sacrificial layer 174 is removed from beneath structural layer 178. In other embodiments, sacrificial layer 174 may be completely removed to increase the size of region 180.

Figure 11A:
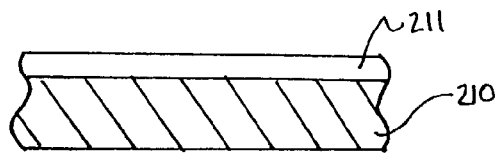
Figure 11B:
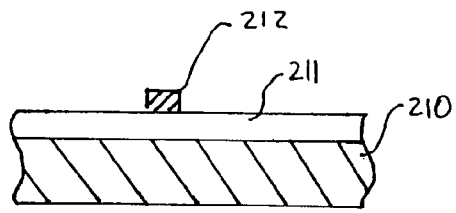
Figure 11C:
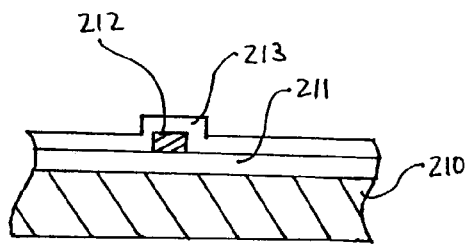
Figure 11D:
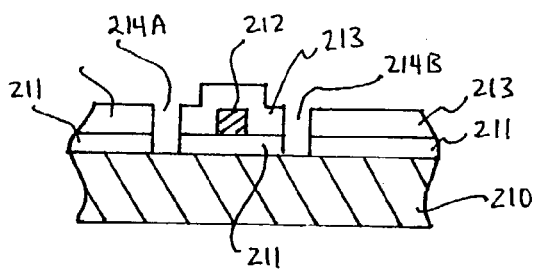
Figure 11E:
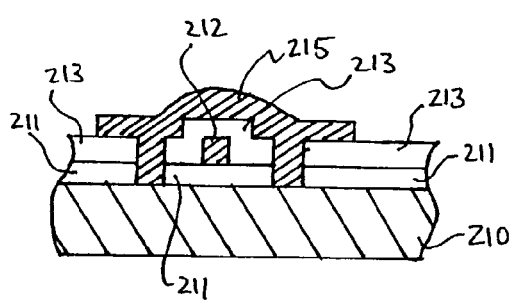
Figure 11F:
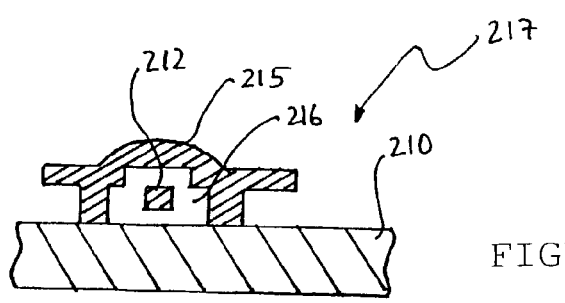

FIGS. 11A through 11F show a cross-sectional view of an example of a type of process which may be used for the fabrication of a micromachined hinge 217 (see FIG. 11F). FIG. 11A shows a substrate 210 which is covered by a first sacrificial layer 211. Typically, first sacrificial layer 211 comprises silicon dioxide deposited using CVD, PVD or some other deposition process. First sacrificial layer 211 may also be formed out of other materials and may comprise a plurality of layers of different materials. In one preferred hinge fabrication technique, there may be a layer of silicon nitride (not shown) in between substrate 210 and sacrificial layer 211 to form an insulating layer used for creating micromachined devices on top of a conductive substrate.

In FIG. 11B, a first layer of polysilicon 212 is deposited on sacrificial layer 211 and is photolithographically patterned to have a desired profile for a hinged structure. For the sake of clarity, only the hinge portion of first polysilicon layer 212 is shown in FIGS. 11B-11F. When fabrication is completed (see FIG. 11F), first polysilicon layer 212 forms the pivotal portion of hinge 217, which pivots about an axis that is orthogonal to the plane of the page.

In FIG. 11C, a second sacrificial layer 213 is formed. Preferably, second sacrificial layer 213 is an oxide layer formed in a similar manner to that of first sacrificial layer 211. Second sacrificial layer 213 may comprise a plurality of layers of different materials. In FIG. 11D, second sacrificial layer 213 is patterned to form anchor points 214A, 214B. Anchor points 214A, 214B preferably extend through first and second sacrificial layers 211, 213 down to substrate 210.

In FIG. 11E, a second layer of polysilicon 215 is deposited and photolithographically patterned to have a desired profile for a hinged structure. When fabrication is completed (see FIG. 11F), second polysilicon layer 215 forms the stationary portion of hinge 217. In FIG. 11F, first and second sacrificial layers 211, 213 are etched away to form hinge 217. Cavity 216 is formed when first and second sacrificial layers 211, 213 are etched from under second polysilicon layer 215. First polysilicon layer 212 may then be pivotted in cavity 216 about an axis orthogonal to the page. First polysilicon layer 212 forms the pivotal portion of hinge 217.

The fabrication technique depicted in FIGS. 11A-11F represents an example of a particular technique for micromachined hinge fabrication which has been included herein for explanatory purposes. The invention is not limited by the method used to form a micromachined hinged structure and may be applied to any micromachined hinged structure regardless of how it is fabricated.

Figure 9A:
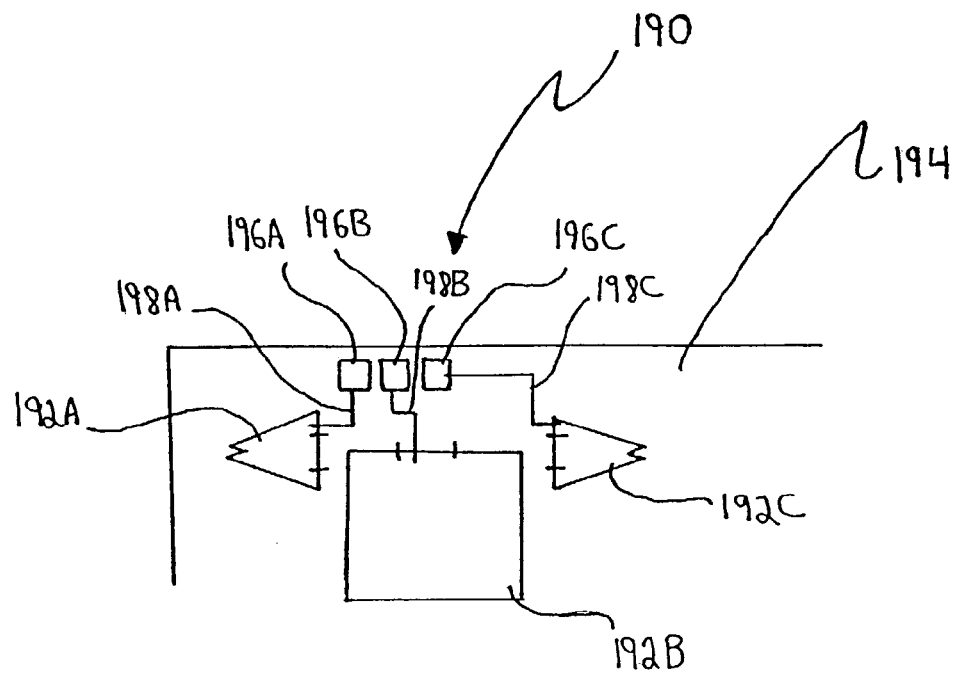
FIG. 9A is a schematic plan view showing an example of how a hinged micromachined structure may be laid-out on a chip.

FIG. 9A depicts an example of one particular scheme for laying out a hinged micromachined structure 190 on a chip 194. Hinged components 192A, 192B, 192C are fabricated on chip 194 as described above. Each component 192 is connected to a corresponding conductive pad 196 by a conductive lead 198. Pads 196 and leads 198 may be made from a variety of materials including, for example, doped silicon, polysilicon, and/or various types of metals. Voltages may be applied to hinged components 192 by attaching external voltage sources (not shown) to pads 196. In addition or in the alternative, chip 194 may contain some voltage control circuitry.

Figure 9B:
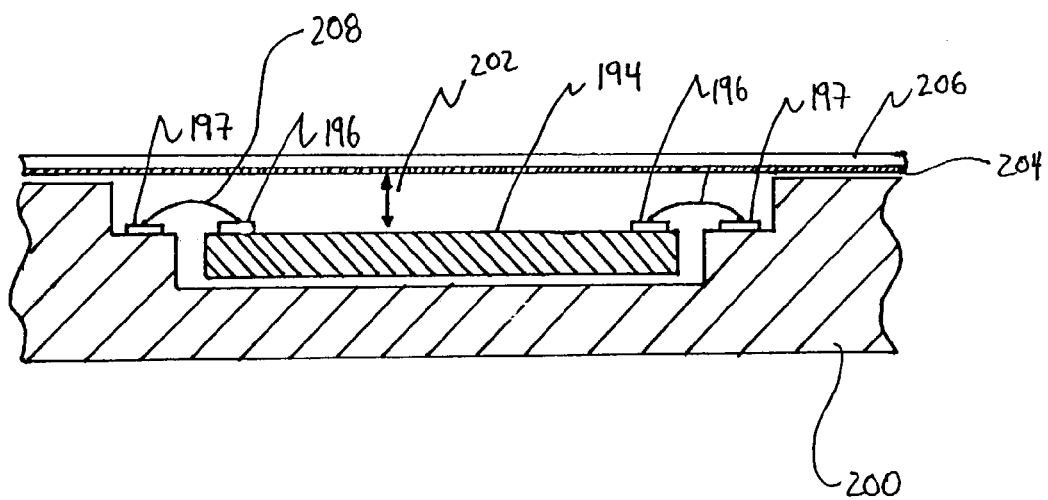
FIG. 9B is a cross-sectional view showing an example of how a chip containing one or more hinged micromachined structures may be packaged.

FIG. 9B depicts an example of one particular scheme for packaging a chip 194 containing a hinged micromachined structure 190 (FIG. 9A). Chip 194 is housed in package 200 which may be made, for example, from a ceramic material. Chip 194 may be secured to package 200 using epoxy, for example. Package 200 preferably comprises a number of pins (not shown). Pads 196 of chip 194 are electrically connected to pads 197 of package 200 by wires 208. Conductive surface 204 is suspended above chip 194, creating a separation distance 202 between conductive surface 204 and the surface of chip 194. Typically, separation distance 202 may be on the order of ~500 μm. For different applications the size of separation distance 202 may vary. Preferably, although not necessarily, conductive surface 204 is thin and partially transparent. Conductive surface 204 may be electrically connected to a voltage source (not shown) or to a ground connection thereof. In the illustrated embodiment, conductive surface 204 is covered with a layer of glass 206 which serves to protect chip 194 and conductive surface 204, while allowing the observation of the raised structures formed on chip 194.

As will be apparent to those skilled in the art in the light of the foregoing disclosure, many alterations and modifications are possible in the practice of this invention without departing from the spirit or scope thereof. For example:

In the embodiments shown and described above, each hinged micromachined component is depicted as having two hinges connecting it to the substrate. In general, hinged micromachined components may have any number of hinges.

In some embodiments, a single conductive surface may be used to create electrostatic forces which simultaneously adjust the positions and/or orientation of various components of a plurality of structures. For example, a relatively large conductive surface which spans a plurality of hinged structures may be provided with a first voltage. Then, the voltages of the various components of the plurality of hinged structures may be simultaneously adjusted relative to the voltage of the conductive surface to provide the electrostatic force required to adjust the positions and orientations of the components. Simultaneous adjustment of the components of a plurality of structures may be referred to as "parallel assembly".

Hinged components may generally be provided with more than one hinged axis. In accordance with the invention, each hinged axis of a particular component may be independently pivoted by the application of electrostatic forces as described above.

The embodiments described above involve imparting voltage onto various surfaces, components and structures. Such voltages may comprise a positive potential, a negative potential and/or a ground potential. The application of a voltage may simply comprise connecting the component to a ground potential. The electrostatic forces caused by the applied voltages may generally be attractive or repulsive.

The use of current flow between components to fuse two or more components together is described above with reference to the embodiment of FIG. 3 and the method of FIG. 10. In general, current may be used to fuse components together in any suitable structure. In addition, components may be joined by adding small droplets of additional materials, such as glue, epoxy, solder and/or photoresist.

As discussed above, the invention may be used to erect self-supporting raised three-dimensional structures comprising a plurality of components. As shown in FIGS. 3A, 3B and 3C, such raised structures may be made self-supporting by electrostatically manipulating one or more first components into desired position(s) and/or orientation(s) using a first set of electrostatic force(s) and simultaneously (or subsequently) manipulating one or more second components into engaging position(s) and/or orientation(s) using a second set of electrostatic forces. In this manner, the second components may be electrostatically manipulated into position(s) and/or orientations where they engage and support the first components. In additional or alternative embodiments, the electrostatic manipulation of a first component (or group of components) may cause corresponding movement of the position and/or orientation of a second component (or group of components), such that the second component(s) engage the first component and mechanically brace or support the first component, without requiring the separate application of electrostatic force(s) to the second component(s). A particular example of such a mechanical support mechanism is depicted in FIGS. 7C and 7D. Those skilled in the art will appreciate that there are many variations of mechanical support mechanisms, wherein the movement of a first component causes a second component to engage and mechanically brace and/or support the first component. For example, a hinged component may comprise a hinge having a locking mechanism (i.e. a second component), such that once the hinged component is electrostatically raised from the substrate, the locking mechanism moves to a position that mechanically engages with the hinged component, locking the hinged component in its raised orientation.

The methods and apparatus disclosed herein may be used in various working environments to achieve desired results. For example, the response time for movement of a hinged component subject to electrostatic force may be varied by changing or removing fluid from the working environment of the component. For example, rather than having an air-based working environment, the working environment may be evacuated, subjected to reduced pressure, or filled with pure nitrogen. Such changes to the working environment may affect the response time of hinged components.

Accordingly, the scope of the invention is to be construed in accordance with the substance defined by the following claims.

What is claimed is:

1. A method for making a three-dimensional structure, the method comprising:
providing a first component which is moveably coupled to a substrate;
moving the first component relative to the substrate by applying a first electrostatic force to the first component; and
engaging a second component with the first component, the second component supporting the first component in a desired orientation relative to the substrate;
wherein engaging the second component with the first component comprises moving the second component relative to the substrate by applying a second electrostatic force to the second component; and
wherein engaging the second component with the first component comprises applying a third electrostatic force between the first component and the second component to move at least one of the first and second components into engagement with one another.

2. A method according to claim 1, wherein moving the first component relative to the substrate comprises pivoting the first component relative to the substrate.

3. A method according to claim 2, wherein engaging the second component with the first component comprises pivoting the second component relative to the substrate by applying a second electrostatic force to the second component.

4. A method according to claim 3 wherein pivoting the first component relative to the substrate comprises pivoting one or more first micro-mechanical hinges and pivoting the second component relative to the substrate comprises pivoting one or more second micro-mechanical hinges.

5. A method according to claim 4, wherein the second component comprises a slot in an edge thereof and engaging the second component with the first component comprises receiving an edge of the first component in the slot.

6. A method according to claim 5, wherein the slot is elongated in a first direction, the first direction substantially orthogonal to a pivot axis of the second component.

7. A method according to claim 6, wherein the slot comprises an inner end and an outer end and the outer end is wider than the inner end.

8. A method according to claim 4 wherein the first component comprises tabs extending outwardly from an edge thereof and the second component comprises one or more notches extending inwardly from an edge thereof and wherein engaging the second component with the first component comprises projecting each of the tabs through a corresponding one of the notches.

9. A method according to claim 8 wherein each of the one or more tabs is tapered such that it narrows as it extends outwardly from the edge of the first component.

10. A method according to claim 9 wherein each of the one or more notches is tapered such that it narrows as it extends inwardly from the edge of the second component.

11. A method according to claim 1, wherein applying the first electrostatic force to the first component comprises:
providing at least one conductive surface in a location proximate to the first component, but spaced apart from the first component and the substrate;
creating a potential difference between the first component and the at least one conductive surface.

12. A method according to claim 11 comprising maintaining the at least one conductive surface at a ground potential.

13. A method according to claim 1, wherein applying the second electrostatic force to the second component comprises:
providing at least one conductive surface in a location proximate to the second component, but spaced apart from the second component and the substrate;
creating a potential difference between the second component and the at least one conductive surface.

14. A method according to claim 13 comprising maintaining the at least one conductive surface at a ground potential.

15. A method according to claim 13, wherein moving the second component relative to the substrate comprises pivoting the second component relative to the substrate.

16. A method according to claim 1, wherein applying the third electrostatic force between the first component and the second component occurs after applying the first electrostatic force to the first component and after applying the second electrostatic force to the second component.

17. A method according to claim 1, wherein applying the third electrostatic force between the first component and the second component comprises creating a potential difference between the first component and the second component.

18. A method according to claim 17 comprising maintaining one of the first and second components at a ground potential.

19. A method according to claim 1, wherein engaging the second component with the first component comprises moving the second component into engagement with the first component.

20. A method according to claim 19, wherein moving the second component into engagement with the first component is accomplished by moving the first component relative to the substrate, the moving of the first component causing corresponding movement of the second component.

21. A method according to claim 1, wherein the second component comprises a slot in an edge thereof and engaging the second component with the first component comprises receiving an edge of the first component in the slot.

22. A method according to claim 1 comprising engaging a plurality of second components with the first component, the second components supporting the first component in a desired orientation relative to the substrate.

23. A method for making a three-dimensional structure, the method comprising:
 providing a first component which is moveably coupled to a substrate;
 moving the first component relative to the substrate by applying a first electrostatic force to the first component, wherein moving the first component relative to the substrate comprises pivoting the first component relative to the substrate; and
 engaging a second component with the first component, the second component supporting the first component in a desired orientation relative to the substrate, wherein engaging the second component with the first component comprises pivoting the second component relative to the substrate by applying a second electrostatic force to the second component;
wherein engaging the second component with the first component comprises applying an engagement electrostatic force between the first and second components to move at least one of the first and second components into a configuration where the first and second components are in engagement with one another;
wherein engaging the second component with the first component comprises passing an electrical current between the first and second components, the electrical current melting a portion of at least one of the first and second components to form a bridge of material therebetween.

24. A method for making a three-dimensional structure, the method comprising:
 providing a first component which is moveably coupled to a substrate;
 moving the first component relative to the substrate by applying a first electrostatic force to the first component, wherein moving the first component relative to the substrate comprises pivoting the first component relative to the substrate and pivoting the first component relative to the substrate comprises pivoting one or more first micro-mechanical hinges;
 engaging a second component with the first component, the second component supporting the first component in a desired orientation relative to the substrate, wherein engaging the second component with the first component comprises pivoting the second component relative to the substrate by applying a second electrostatic force to the second component and pivoting the second component relative to the substrate comprises pivoting one or more second micro-mechanical hinges;
 providing a brace component pivotally coupled to the substrate; and
 pivoting the brace component relative to the substrate, thereby engaging the brace component with the edge of the first component and the edge of the second component, the brace component supporting the first and second components in a desired orientation relative to the substrate
wherein the first component comprises one or more tabs extending outwardly from an edge thereof, each of the one or more tabs tapered such that it narrows as it extends outwardly from the edge of the first component, and the second component comprises one or more notches extending inwardly from an edge thereof, each of the one or more notches tapered such that it narrows as it extends inwardly from the edge of the second component, and wherein engaging the second component with the first component comprises projecting each of the tabs through a corresponding one of the notches.

25. A method according to claim 24 wherein the brace component comprises a slot in an edge thereof and engaging the brace component with the edge of the first component and the edge of the second component comprises receiving the edge of the first component and the edge of the second component in the slot.

26. A method according to claim 25 wherein the slot comprises an inner end and an outer end and the outer end is wider than the inner end.

27. A method for making a three-dimensional structure, the method comprising:
 providing a first component which is moveably coupled to a substrate;
 moving the first component relative to the substrate by applying a first electrostatic force to the first component; and
 engaging a second component with the first component, the second component supporting the first component in a desired orientation relative to the substrate;
wherein engaging the second component with the first component comprises applying an engagement electrostatic force between the first and second components to move at least one of the first and second components into a configuration where the first and second components are in engagement with one another;
wherein engaging the second component with the first component comprises passing an electrical current between the first and second components, the electrical current melting a portion of at least one of the first and second components to form a bridge of material therebetween.

28. A method for making a three-dimensional structure, the method comprising:

providing a plurality of components hingedly coupled to a substrate;

pivoting the components into positions in which the components can be inter-engaged by applying electrostatic forces to the components; and engaging the components with one another to provide a three-dimensional structure;

wherein engaging the components with one another comprises applying an engagement electrostatic force between the components to move at least one of the components into a configuration where the components are in engagement with one another;

wherein engaging the components with one another comprises passing an electrical current between a first one of the plurality of components and a second one of the plurality of components, the electrical current melting a portion of at least one of the first one of the plurality of components and the second one of the plurality of components to form a bridge of material therebetween.

29. A method for making a three-dimensional structure, the method comprising:

providing a first component pivotally coupled to a substrate and a brace component pivotally coupled to the substrate;

applying a first electrostatic force to the first component to pivot the first component about a first axis;

applying a second electrostatic force to the brace component to pivot the brace component about a second axis; and applying a third electrostatic force between the first component and the brace component, the third electrostatic force attracting the brace component toward the first component, further pivoting the brace component about the second axis until the brace component engages and supports the first component in a substantially upright orientation.

30. A method according to claim 29, wherein the first and second axes are substantially orthogonal.

31. A method according to claim 30, wherein applying the first electrostatic force to the first component comprises:

providing at least one conductive surface in a location proximate to the first component;

applying a first voltage to the first component and a second voltage to the at least one conductive surface.

32. A method according to claim 31, wherein applying the second voltage to the at least one conductive surface comprises connecting the at least one conductive surface to a ground potential.

33. A method according to claim 30, wherein applying the second electrostatic force to the brace component comprises:

providing at least one conductive surface in a location proximate to the brace component;

applying a first voltage to the brace component and a second voltage to the at least one conductive surface.

34. A method according to claim 33, wherein applying the second voltage to the at least one conductive surface comprises connecting the at least one conductive surface to a ground potential.

35. A method according to claim 30, wherein applying the third electrostatic force between the first component and the brace component comprises applying a first voltage to the first component and a second voltage to the brace component.

36. A method according to claim 29, wherein the brace component comprises a slot in an edge thereof and further pivoting the brace component about the second axis until the brace component engages and supports the first component comprises receiving an edge of the first component in the slot.

37. A method according to claim 36, wherein the slot is elongated in a first direction, the first direction substantially orthogonal to the second axis.

38. A method according to claim 37, wherein the slot comprises an inner end and an outer end and the outer end is wider than the inner end.

39. A method according to claim 29 comprising:

providing a plurality of brace components, each pivotally mounted to the substrate about a corresponding axis;

applying a second electrostatic force to each of the brace components to pivot each of the brace components about its corresponding axis; and applying a third electrostatic force between the first component and each of the brace components, the third electrostatic force attracting the brace components toward the first component, further pivoting the brace components about their corresponding axes until each of the brace components engages and supports the first component in the substantially upright orientation.

* * * * *